(12) United States Patent
Cho et al.

(10) Patent No.: US 12,402,302 B2
(45) Date of Patent: Aug. 26, 2025

(54) SEMICONDUCTOR MEMORY DEVICE AND METHOD FOR MANUFACTURING THE SAME

(71) Applicant: Samsung Electronics Co., Ltd., Suwon-si (KR)

(72) Inventors: Seongkeun Cho, Suwon-si (KR); Jae Seong Park, Seoul (KR); Youngseok Kim, Seoul (KR); Young Sin Kim, Hwaseong-si (KR); Daeyoung Moon, Seoul (KR); Keum Joo Lee, Hwaseong-si (KR); Sung-Wook Jung, Seoul (KR); Sungduk Hong, Yongin-si (KR); Suhwan Hwang, Seongnam-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 470 days.

(21) Appl. No.: 18/056,085

(22) Filed: Nov. 16, 2022

(65) Prior Publication Data

US 2023/0247823 A1    Aug. 3, 2023

(30) Foreign Application Priority Data

Jan. 28, 2022   (KR) ........................ 10-2022-0012906

(51) Int. Cl.
*H10B 12/00*    (2023.01)
*G11C 5/06*    (2006.01)

(52) U.S. Cl.
CPC .......... *H10B 12/315* (2023.02); *G11C 5/063* (2013.01); *H10B 12/50* (2023.02)

(58) Field of Classification Search
None
See application file for complete search history.

(56) References Cited

U.S. PATENT DOCUMENTS

| | | |
|---|---|---|
| 5,773,844 A | 6/1998 | Kawamura et al. |
| 6,635,588 B1 | 10/2003 | Hawryluk et al. |
| 6,916,690 B2 | 7/2005 | Chang |
| 7,943,936 B2 | 5/2011 | Hiramatsu et al. |
| 8,441,850 B2 | 5/2013 | Lee et al. |
| 9,349,870 B2 | 5/2016 | Wang et al. |
| 2013/0099298 A1 | 4/2013 | Kim |
| 2021/0082924 A1* | 3/2021 | Seong .................. H10B 12/315 |

FOREIGN PATENT DOCUMENTS

| | | |
|---|---|---|
| JP | 5756692 B2 | 7/2015 |
| KR | 2012/0004774 A | 1/2012 |

* cited by examiner

*Primary Examiner* — Steven M Page
(74) *Attorney, Agent, or Firm* — Fish & Richardson P.C.

(57) ABSTRACT

A semiconductor memory device includes a substrate including a cell area and a peripheral area defined by a periphery of the cell area, the cell area including a dummy cell area and a normal cell area, and an active area defined by a cell element isolation film. The device includes a cell area separation film defining the cell area in the substrate, the dummy cell area defining a boundary with the cell area separation film between the normal cell area and the cell area separation film. The device includes a normal bit-line on the normal cell area and extending in a first direction, a dummy bit-line group on the dummy cell area, the dummy bit-line group including a plurality of dummy bit-lines extending in the first direction, and a plurality of storage contacts connected to the active area and located along a second direction perpendicular to the first direction.

20 Claims, 33 Drawing Sheets

SEMICONDUCTOR MEMORY DEVICE AND METHOD FOR MANUFACTURING THE SAME

CROSS-REFERENCE TO RELATED APPLICATION

This application claims priority from Korean Patent Application No. 10-2022-0012906 filed on Jan. 28, 2022, in the Korean Intellectual Property Office, and all the benefits accruing therefrom under 35 U.S.C. 119, the contents of which in its entirety are herein incorporated by reference.

FIELD

The present inventive concepts relate to a semiconductor memory device and/or a method for manufacturing the same, and more specifically, to a semiconductor memory device having a plurality of wire lines intersecting with each other and buried contacts, and/or a method for manufacturing the same.

BACKGROUND

A semiconductor device has an increasingly higher integration level. Thus, in order to implement more semiconductor elements in the same area, individual circuit patterns are increasingly smaller. In other words, as the integration level of the semiconductor memory device increases, a design rule for components of the semiconductor memory device is decreasing.

In a highly scaled semiconductor device, a process of forming a plurality of wire lines and a plurality of buried contacts (BC) interposed between the lines is becoming increasingly complex and difficult.

SUMMARY

Aspects of the present inventive concepts provide a semiconductor memory device that may have improved reliability and performance.

Another aspect of the present inventive concepts is to provide a method for manufacturing a semiconductor memory device that may have improved reliability and performance.

Example embodiments of the present inventive concepts are not limited to the above-mentioned aspects. Other aspects and advantages in accordance with the present inventive concepts as not mentioned above may be understood from following descriptions and more clearly understood from example embodiments in accordance with the present inventive concepts. Further, it will be readily appreciated that aspects and advantages in accordance with the present inventive concepts may be realized by features and combinations thereof as disclosed in the claims.

According to an aspect of the present inventive concepts, a semiconductor memory device includes a substrate including a cell area and a peripheral area defined by a periphery of the cell area, wherein the cell area includes a dummy cell area and a normal cell area, wherein the cell area includes an active area defined by a cell element isolation film, a cell area separation film defining the cell area in the substrate, wherein the dummy cell area defines a boundary with the cell area separation film between the normal cell area and the cell area separation film, and a normal bit-line on the normal cell area and extending in a first direction. The device includes a dummy bit-line group on the dummy cell area, wherein the dummy bit-line group includes a plurality of dummy bit-lines extending in the first direction, and a plurality of storage contacts connected to the active area and located along a second direction perpendicular to the first direction, wherein a width in the second direction of the dummy cell area is greater than or equal to 50 nm and less than or equal to 200 nm, wherein the normal bit-line has a first width in the second direction, and wherein a ratio of a width in the second direction of each of the dummy bit-lines to the first width is greater than or equal to 1 and less than or equal to 2.

According to another aspect of the present inventive concepts, a semiconductor memory device includes a substrate including a cell area and a peripheral area defined by a periphery of the cell area, wherein the cell area includes a dummy cell area and a normal cell area, wherein the cell area includes an active area defined by a cell element isolation film, a cell area separation film defining the cell area in the substrate, wherein the dummy cell area forms a boundary with the cell area separation film between the normal cell area and the cell area separation film, and a normal bit-line group on the normal cell area. The device includes a dummy bit-line group on the dummy cell area, wherein the dummy bit-line group includes a plurality of dummy bit-lines extending in a first direction, and a plurality of storage contacts connected to the active area and located along a second direction perpendicular to the first direction. The dummy cell area forms a boundary with the cell area separation film between the normal cell area and the cell area separation film, the normal bit-line group includes a plurality of normal bit-lines extending in the first direction, the plurality of normal bit-lines are spaced from each other by a bit-line pitch in the second direction, a width in the second direction of the dummy cell area is greater than the bit-line pitch and is less than or equal to 5 times the bit-line pitch, each of the normal bit-lines has a first width in the second direction, and a ratio of a width in the second direction of each of the dummy bit-lines to the first width is greater than or equal to 1 and less than or equal to 2.

According to an aspect of the present inventive concepts, a semiconductor memory device includes a substrate including a cell area and a peripheral area defined by a periphery of the cell area, wherein the cell area includes a dummy cell area and a normal cell area, wherein the cell area includes an active area defined by a cell element isolation film, a cell area separation film defining the cell area in the substrate, wherein the dummy cell area forms a boundary with the cell area separation film between the normal cell area and the cell area separation film, and a normal bit-line on the normal cell area and extending in a first direction. The device includes a dummy bit-line group on the dummy cell area, wherein the dummy bit-line group includes a plurality of dummy bit-lines extending in the first direction, and a plurality of storage contacts connected to the active area and located along a second direction perpendicular to the first direction, wherein a width in the second direction of the dummy cell area is greater than or equal to 50 nm and less than or equal to 200 nm, wherein a width in the second direction of the normal bit-line is greater than or equal to 5 nm and less than or equal to 25 nm, and wherein a width in the second direction of each of the dummy bit-lines is greater than or equal to 5 nm and less than or equal to 30 nm.

BRIEF DESCRIPTION OF DRAWINGS

The above and other aspects and features of the present inventive concepts will become more apparent by describing in detail example embodiments thereof with reference to the attached drawings, in which.

DETAILED DESCRIPTION

Figure 1:
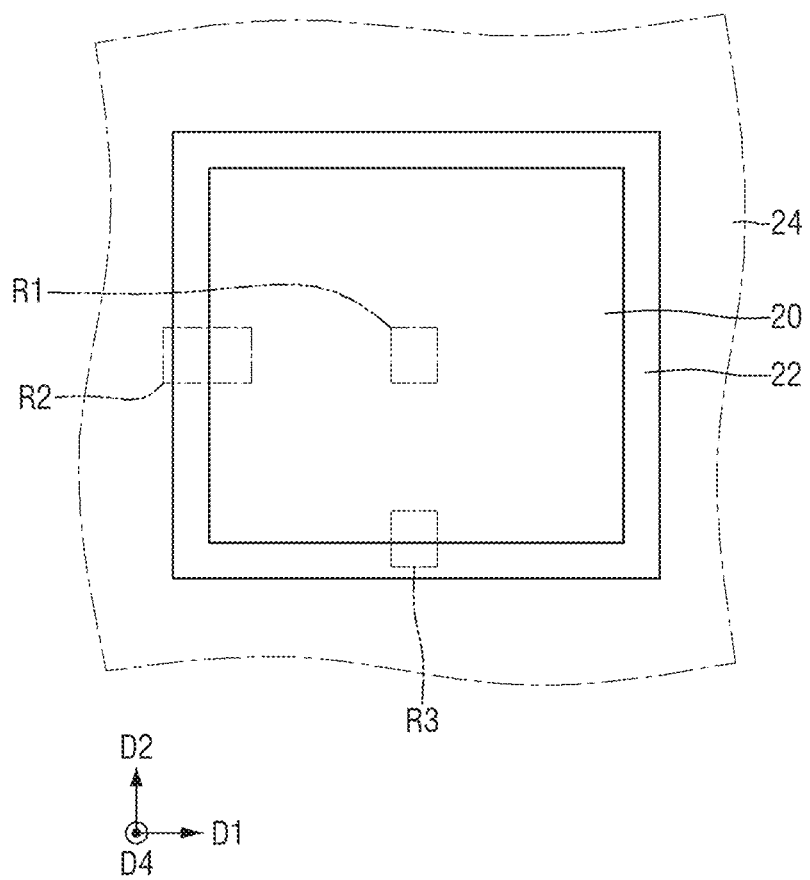
FIG. 1 is a schematic layout of a semiconductor memory device according to some example embodiments.

For simplicity and clarity of illustration, elements in the figures are not necessarily drawn to scale. The same reference numbers in different figures represent the same or similar elements, and as such perform similar functionality. Further, descriptions and details of well-known steps and elements are omitted for simplicity of the description. Furthermore, in the following detailed description of the present inventive concepts, numerous specific details are set forth in order to provide a thorough understanding of the present inventive concepts. However, it will be understood that the present inventive concepts may be practiced without these specific details. In other instances, some methods, procedures, components, and circuits have not been described in detail so as not to unnecessarily obscure aspects of the present inventive concepts.

Examples of various example embodiments are illustrated and described further below. It will be understood that the description herein is not intended to limit the claims to the specific example embodiments described. On the contrary, it is intended to cover alternatives, modifications, and equivalents as may be included within the scope of the present inventive concepts.

A shape, a size, a ratio, an angle, a number, etc. disclosed in the drawings for illustrating example embodiments of the present inventive concepts are illustrative, and the present inventive concepts are not limited thereto. The same reference numerals refer to the same elements herein. Further, descriptions and details of some steps and elements may be omitted for simplicity of the description. Furthermore, in the following detailed description of the present inventive concepts, numerous specific details are set forth in order to provide a thorough understanding of the present inventive concepts. However, it will be understood that the present inventive concepts may be practiced without these specific details. In other instances, some methods, procedures, components, and circuits have not been described in detail so as not to unnecessarily obscure aspects of the present inventive concepts.

The terminology used herein is for the purpose of describing particular example embodiments only and is not intended to limit the present inventive concepts. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entirety of list of elements and may not modify the individual elements of the list. When referring to "C to D", this means C inclusive to D inclusive unless otherwise specified.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the scope of the present inventive concepts.

In addition, it will also be understood that when a first element or layer is referred to as being present "on" or "beneath" a second element or layer, the first element may be disposed directly on or beneath the second element or may be disposed indirectly on or beneath the second element with a third element or layer being disposed between the first and second elements or layers.

It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like is disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

Unless otherwise defined, all terms including technical and scientific terms used herein have the same meaning as commonly understood by one of ordinary skill in the art to which the inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In one example, when a certain example embodiment may be implemented differently, a function or operation specified in a specific block may occur in a sequence different from that specified in a flowchart. For example, two consecutive blocks may actually be executed at the same time. Depending on a related function or operation, the blocks may be executed in a reverse sequence.

In descriptions of temporal relationships, for example, temporal precedent relationships between two events such as "after", "subsequent to", "before", etc., another event may occur therebetween unless "directly after", "directly subsequent" or "directly before" is not indicated.

The features of the various example embodiments of the present inventive concepts may be partially or entirely combined with each other, and may be technically associated with each other or operate with each other. The example embodiments may be implemented independently of each other and may be implemented together in an association relationship.

Spatially relative terms, such as "beneath," "below," "lower," "under," "above," "upper," and the like, may be used herein for ease of explanation to describe one element or feature's relationship to another element or feature as illustrated in the figures. It will be understood that the spatially relative terms are intended to encompass different orientations of the device in use or in operation, in addition to the orientation depicted in the figures. For example, when the device in the figures is turned over, elements described as "below" or "beneath" or "under" other elements or features would then be oriented "above" the other elements or features. Thus, the example terms "below" and "under" may encompass both an orientation of above and below. The device may be otherwise oriented for example, rotated 90 degrees or at other orientations, and the spatially relative descriptors used herein should be interpreted accordingly.

"D1 direction" and "D2 axis direction" should not be interpreted only to have a geometric relationship in which the D1 direction, and the D2 direction are perpendicular to each other. "D1 direction" and "D2 direction" may be interpreted to have a broader direction within a range in which components herein may work functionally.

Figure 2:
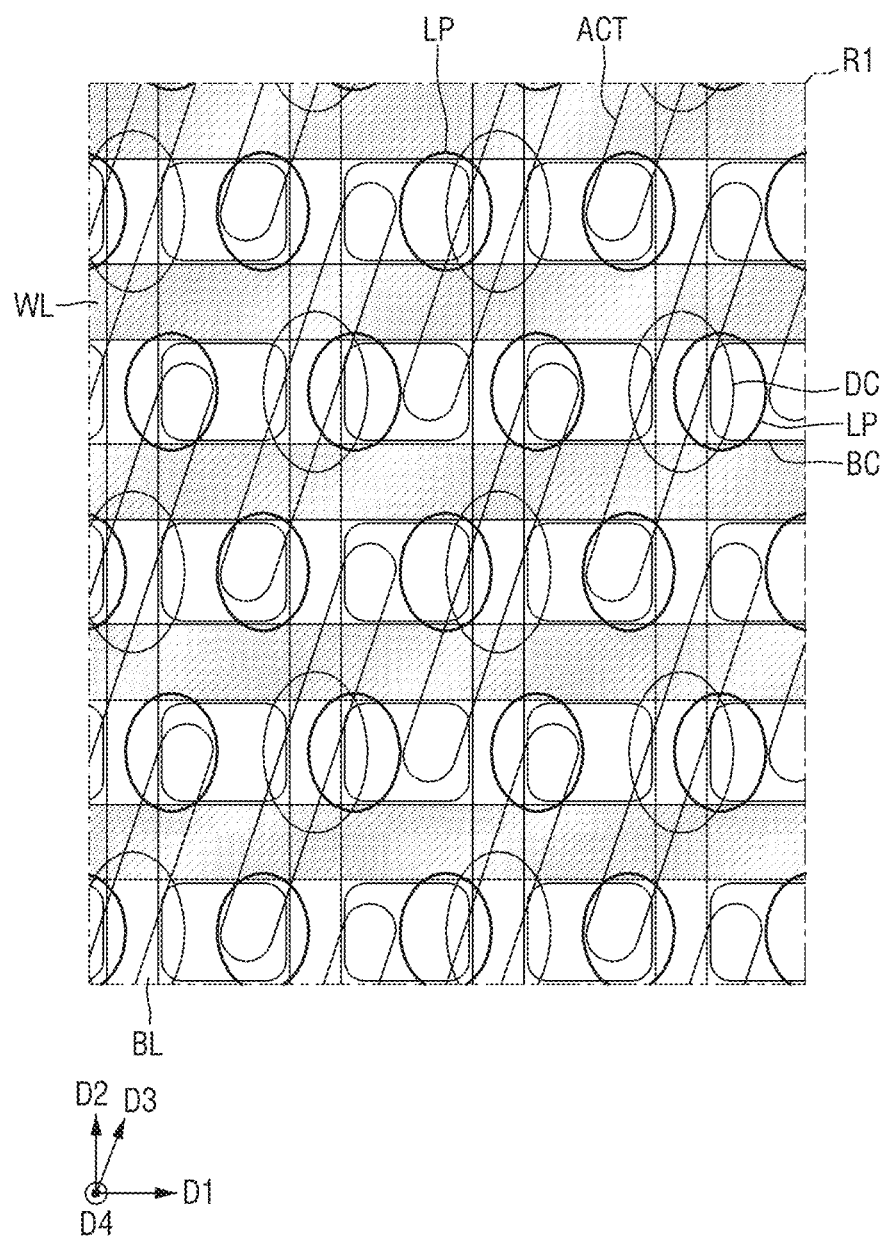
FIG. 2 is an enlarged schematic layout of a R1 portion of FIG. 1.
Figure 3:
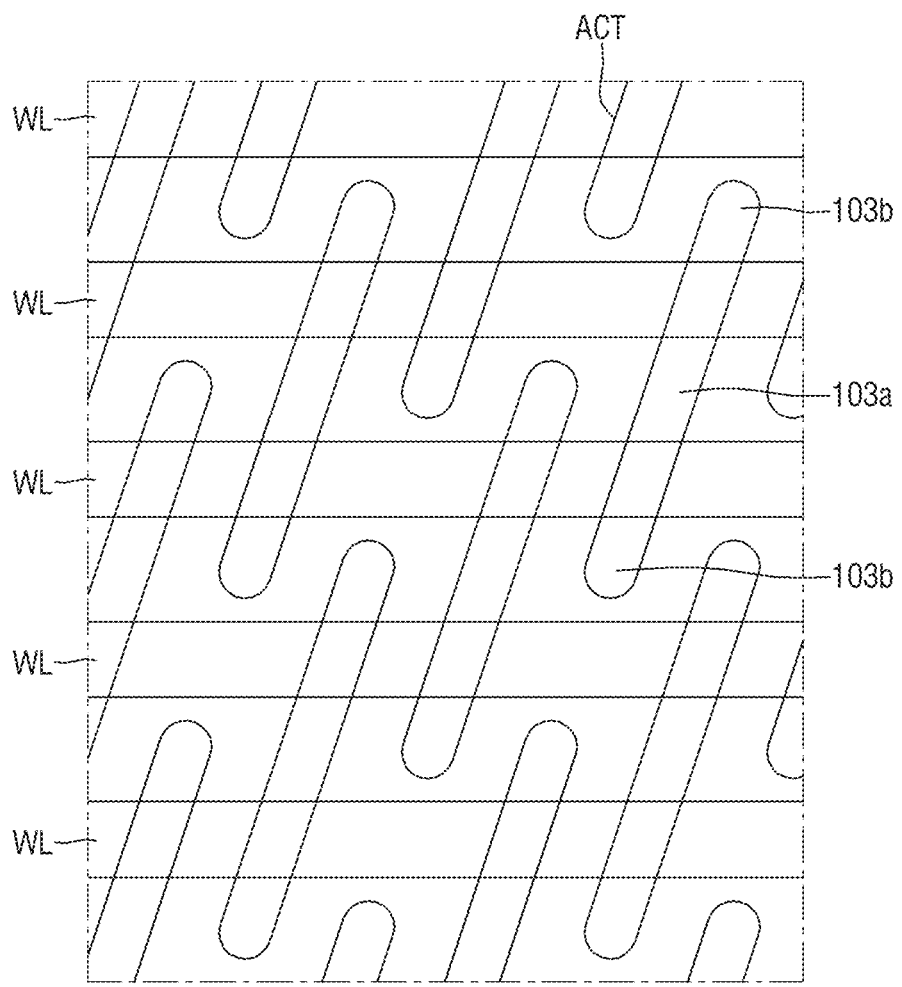
FIG. 3 is a layout showing only a word-line and an active area of FIG. 2.
Figure 3:
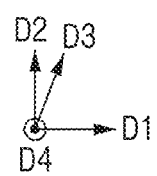
Figure 4:
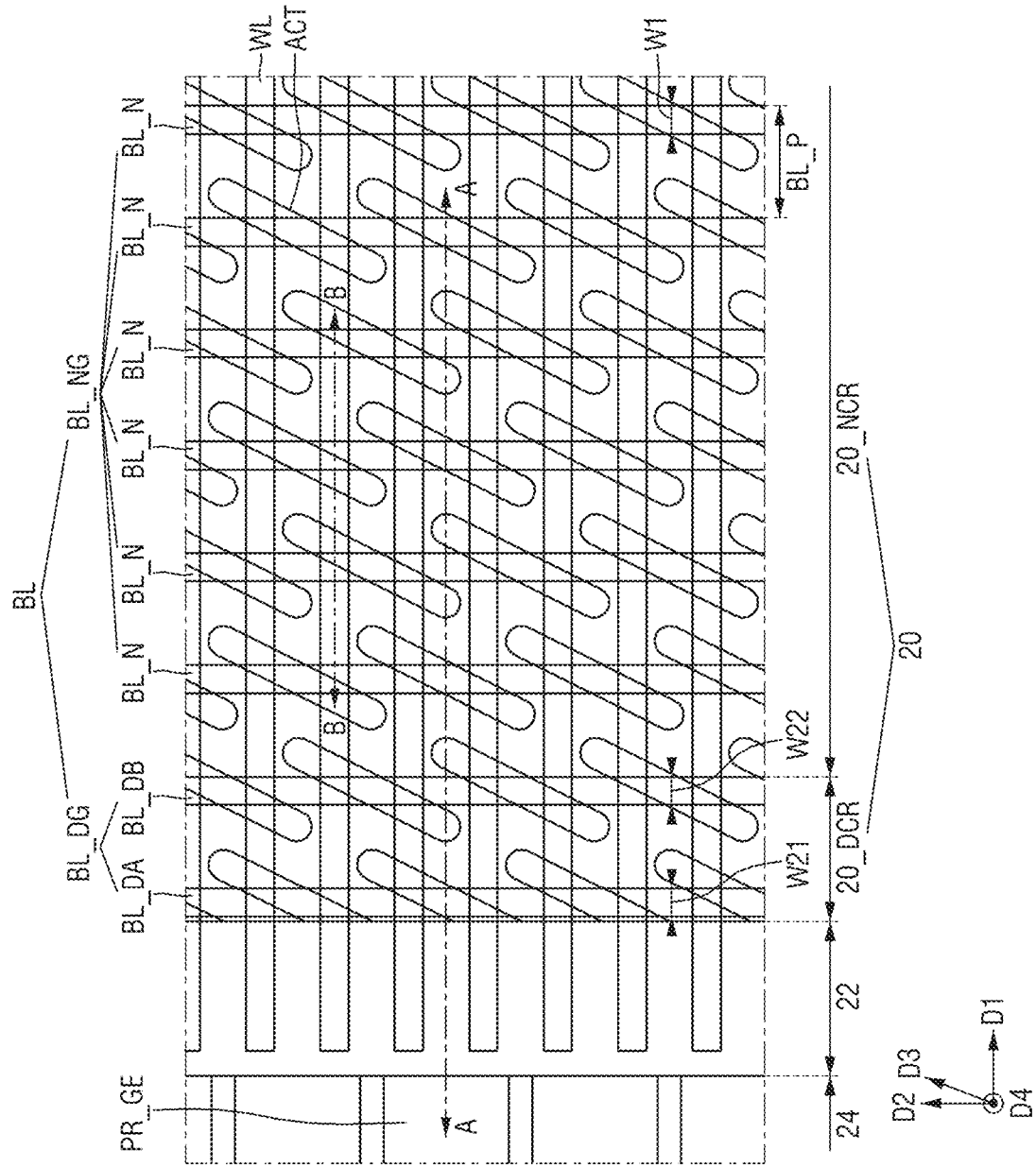
FIG. 4 is a schematic layout diagram of a R2 area of FIG. 1.
Figure 5:
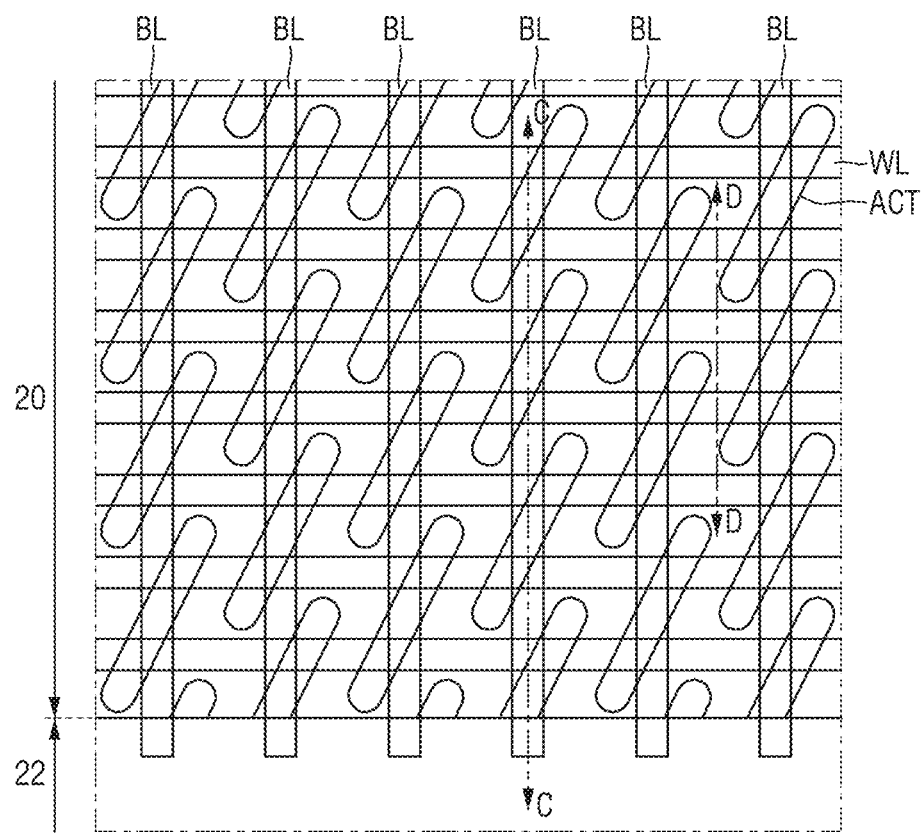
FIG. 5 is a schematic layout diagram of a R3 area of FIG. 1.
Figure 5:
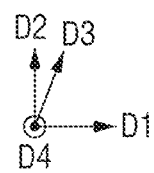
Figure 6:
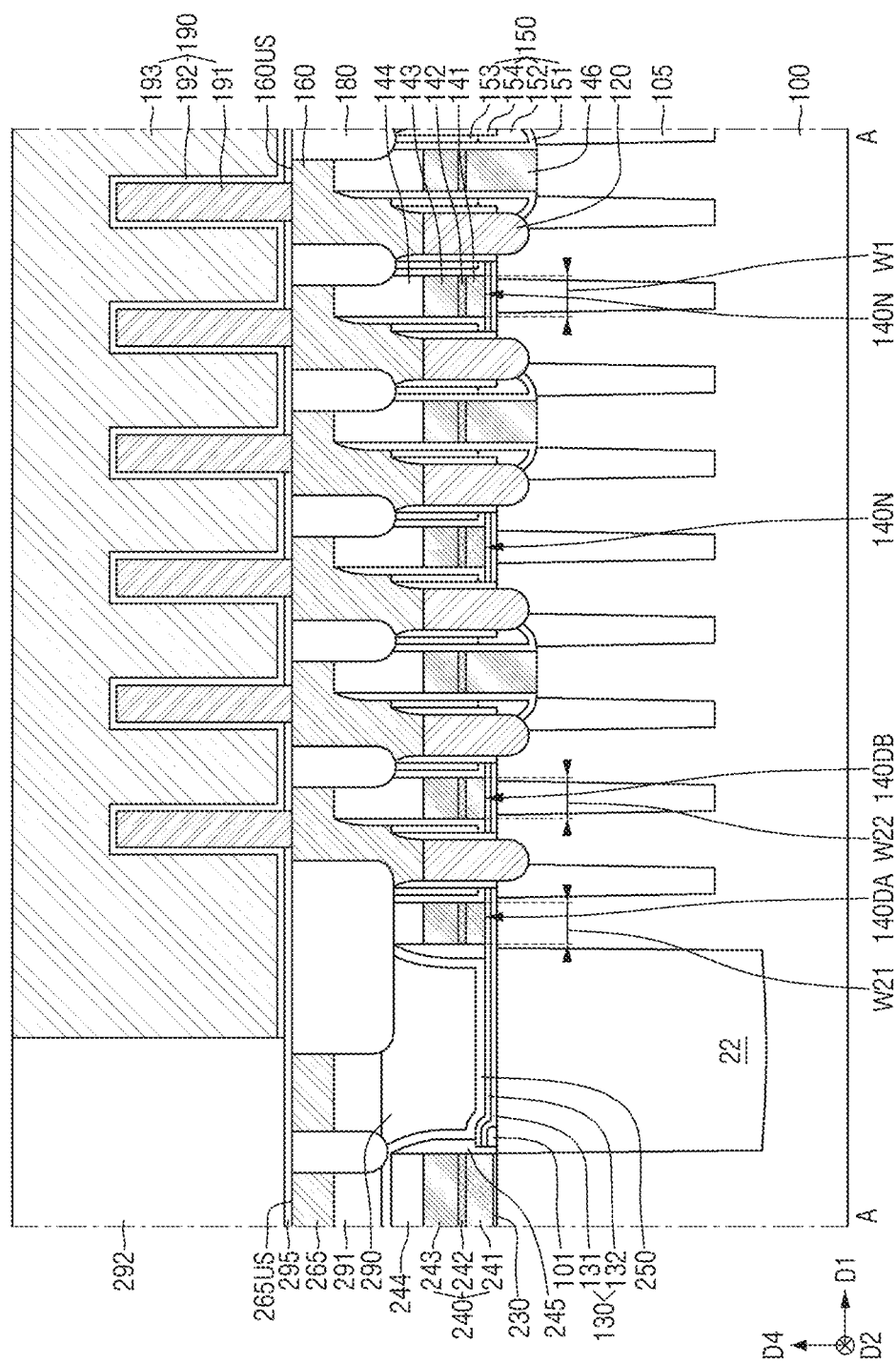
FIG. 6 is an illustrative cross-sectional view taken along A-A of FIG. 4.
Figure 7:
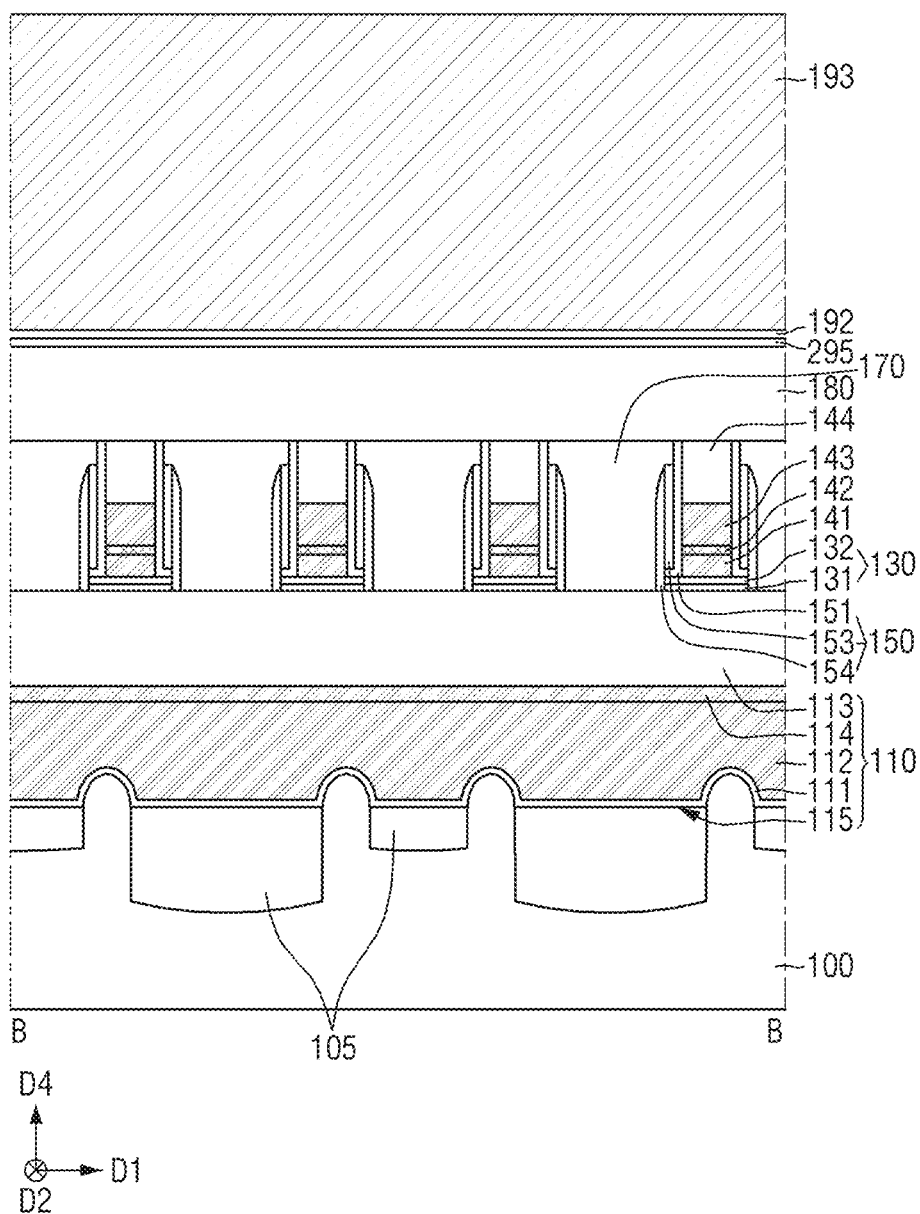
FIG. 7 is an illustrative cross-sectional view taken along B-B of FIG. 4.
Figure 8:
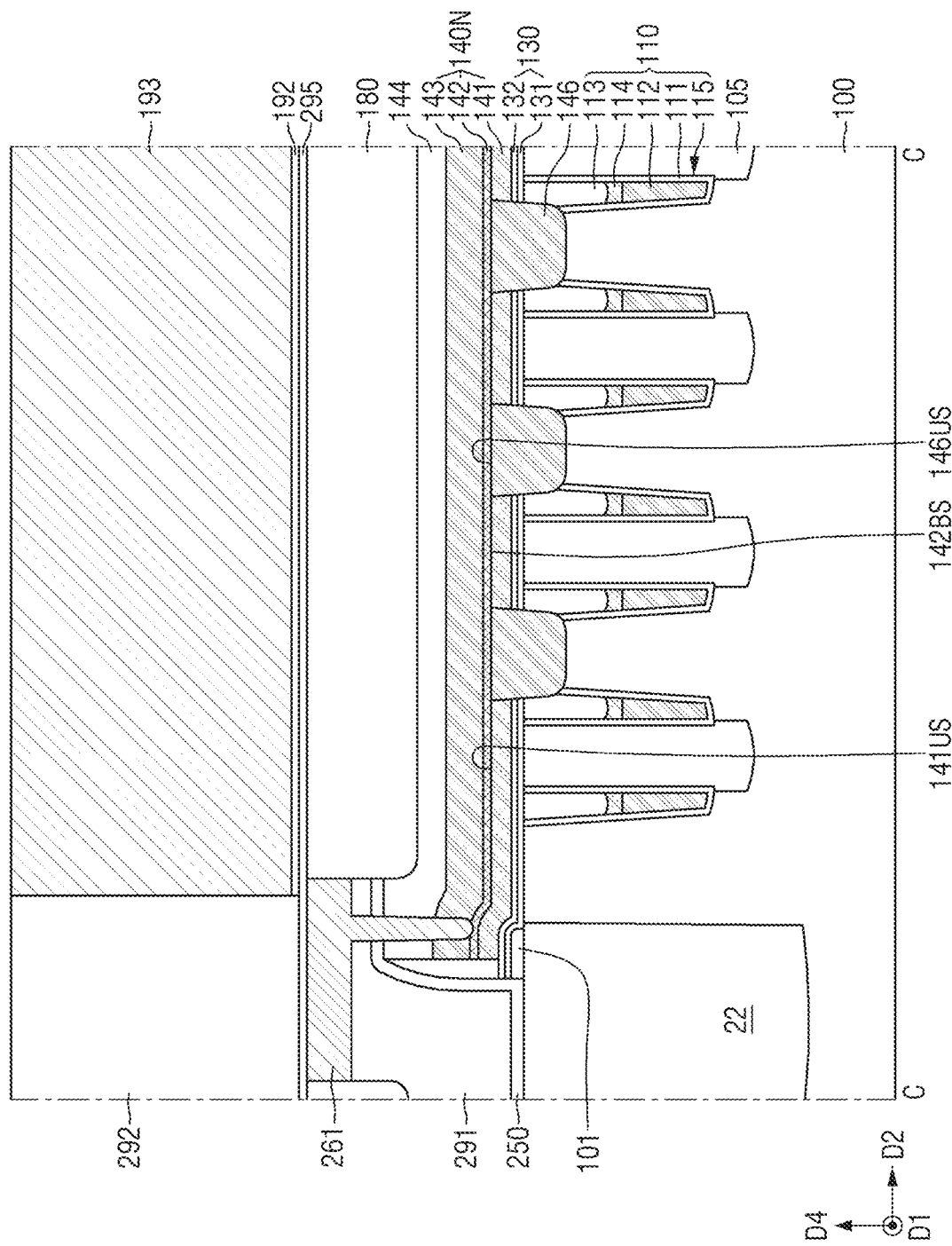
FIG. 8 is an illustrative cross-sectional view taken along C-C of FIG. 5.
Figure 9:
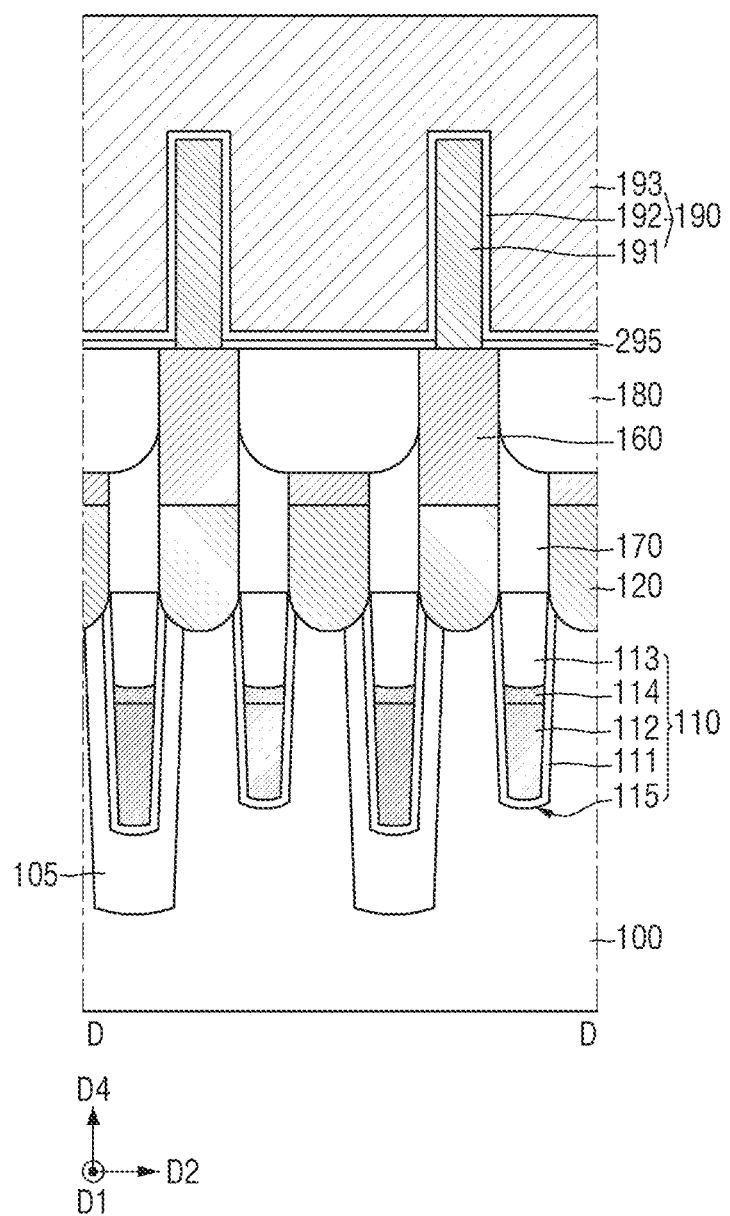
FIG. 9 is an illustrative cross-sectional view taken along D-D of FIG. 5

FIG. 1 is a schematic layout of a semiconductor memory device according to some example embodiments. FIG. 2 is an enlarged schematic layout of a R1 portion of FIG. 1. FIG. 3 is a layout showing a word-line and an active area of FIG. 2. FIG. 4 is a schematic layout diagram of a R2 area of FIG. 1. FIG. 5 is a schematic layout diagram of a R3 area of FIG. 1. FIG. 6 is an illustrative cross-sectional view taken along A-A of FIG. 4. FIG. 7 is an illustrative cross-sectional view taken along B-B of FIG. 4. FIG. 8 is an illustrative cross-sectional view taken along C-C of FIG. 5. FIG. 9 is an illustrative cross-sectional view taken along D-D of FIG. 5.

In a diagram of a semiconductor memory device according to some example embodiments, DRAM (Dynamic Random Access Memory) is illustrated by way of example. However, the present inventive concepts are not limited thereto.

Referring to FIG. 1 to FIG. 5, a semiconductor memory device according to some example embodiments may include a cell area 20, a cell area separation film 22, and a peripheral area 24.

The cell area separation film 22 may be formed along an outer edge of the cell area 20. The cell area separation film 22 may separate the cell area 20 and the peripheral area 24 from each other. The cell area separation film 22 defines the cell area 20. The peripheral area 24 may be defined as a periphery around the cell area 20.

The cell area 20 may include a plurality of cell active areas ACT. The cell active area ACT may be defined by a cell element isolation film (105 in FIG. 6 to FIG. 9) formed in a substrate (100 in FIG. 6). As the design rule of the semiconductor memory device decreases, the cell active area ACT may have a bar shape extending in a diagonal line or an oblique line as shown in FIG. 2. For example, the cell active area ACT may extend in a third direction D3.

Each of a plurality of gate electrodes may extend in a first direction D1 and across the cell active area ACT. The plurality of gate electrodes may extend parallel or substantially parallel to each other. Each of the plurality of gate electrodes may be embodied as, for example, each of a plurality of word-lines WL. The word-lines WL may be spaced from each other by an equal or substantially equal spacing. A width of the word-line WL or a spacing between word-lines WL may be determined according to the design rule.

The cell area 20 may include a dummy cell area 20_DCR and a normal cell area 20_NCR. The dummy cell area 20_DCR may be disposed on each of both opposing sides in the first direction D1 of the normal cell area 20_NCR.

A boundary extending in the second direction D2 may be formed between the dummy cell area 20_DCR and the cell area separation film 22. That is, the boundary between the dummy cell area 20_DCR and the cell area separation film 22 may extend in an elongate manner in the second direction D2. The dummy cell area 20_DCR is located between the normal cell area 20_NCR and the cell area separation film 22.

The word-line WL may extend to the cell area separation film 22. A portion of the word-line WL may overlap the cell area separation film 22 in a fourth direction D4.

The two word-lines WLs extending in the first direction D1 may allow each cell active area ACT to be divided into three portions. The cell active area ACT may include a storage connection area 103b and a bit-line connection area 103a. The bit-line connection area 103a may be located at a middle portion of the cell active area ACT, while the storage connection area 103*b* may be located at an end of the cell active area ACT.

A plurality of bit-lines BL extending in a second direction D2 perpendicular or substantially perpendicular to the extension direction of the word-line WL may be disposed on the word-lines WL. The plurality of bit-line BL may extend parallel or substantially parallel to each other. The bit-lines BL may be arranged to be spaced from each other by the same spacing. A width of the bit-line BL or a spacing between bit-lines BLs may be determined according to the design rule.

The bit-line BL may extend to the cell area separation film 22. A portion of the bit-line BL may overlap the cell area separation film 22 in the fourth direction D4. The fourth direction D4 may be orthogonal to the first direction D1, the second direction D2, and the third direction D3. The fourth direction D4 may be a thickness direction of the substrate 100.

The plurality of bit-lines BL may include a normal bit-line group BL_NG and a dummy bit-line group BL_DG. The dummy bit-line group BL_DG may be disposed in the dummy cell area 20_DCR. The normal bit-line group BL_NG may be disposed in the normal cell area 20_NCR.

The dummy bit-line group BL_DG may be disposed at a boundary of the cell area 20. The dummy bit-line group BL_DG may be disposed at the boundary of the cell area 20 extending in the second direction D2. Because the dummy bit-line groups BL_DG are respectively disposed at the boundaries of the cell area 20 extending in the second direction D2, the normal bit-line group BL_NG may be disposed between the dummy bit-line groups BLDG.

The normal bit-line group BL_NG may include a plurality of normal bit-lines BL_N extending in the second direction D2. The normal bit-line BL_N may act as a bit-line used for operation of a memory cell included in the semiconductor memory device.

The normal bit-lines BL_N may be spaced apart from each other in the first direction D1. For example, the normal bit-lines BL_N may be spaced from each other by a bit-line pitch BL_P. That is, a spacing between the normal bit-lines BL_N adjacent to the first direction D1 may be the bit-line pitch BL_P.

The dummy bit-line group BL_DG may include a plurality of dummy bit-lines BL_DA and BL_DB extending in the second direction D2. Each of the plurality of dummy bit-lines BL_DA and BL_DB may act as a bit-line that is not used for operation of the memory cell included in the semiconductor memory device. For example, because a voltage source or a current source is not connected to the plurality of dummy bit-lines BL_DA and BL_DB, each of the plurality of dummy bit-lines BL_DA and BL_DB may be in an electrically floating state.

The dummy bit-line group BL_DG may include an outermost dummy bit-line BL_DA that is closest to the peripheral area 24 in the first direction D1. The dummy bit-line group BL_DG may include an inner dummy bit-line BL_DB disposed between the outermost dummy bit-line BL_DA and the normal bit-line BL_N.

The outermost dummy bit-line BL_DA may extend in the second direction D2 and in parallel with the inner dummy bit-line BL_DB. The outermost dummy bit-line BL_DA is spaced apart from the inner dummy bit-line BL_DB in the first direction D1. Although the outermost dummy bit-line BL_DA may not overlap with the cell area separation film 22 in the first direction D1, the present inventive concepts are not limited thereto.

The dummy bit-line group BL_DG may include, for example, 2 to 6 dummy bit-lines (or more or less). For example, the inner dummy bit-line BL_DB may include 1 to 5 dummy bit-lines (or more).

In FIG. 4, the dummy bit-line group BL_DG may include two dummy bit-lines. The dummy bit-line group BL_DG disposed on one side of the normal bit-line group BL_NG may include, for example, the outermost dummy bit-line BL_DA and one inner dummy bit-line BL_DB.

A width of the dummy cell area 20_DCR in the first direction D1 may be, for example, in a range from 50 nm to 200 nm (or more or less). For example, the width of the dummy cell area 20_DCR may refer to a distance from the boundary of the cell area 20 and the cell area separation film 22 to a sidewall of the inner dummy bit-line BL_DB closest to the normal bit-line BL_N.

The width of the dummy cell area 20_DCR in the first direction D1 may be greater than the bit-line pitch BL_P. The width of the dummy cell area 20_DCR in the first direction D1 may be smaller than or equal to 5 times of the bit-line pitch BL_P.

The width of the dummy cell area 20_DCR in the first direction D1 may vary based on the number of the dummy bit-lines included in the dummy bit-line group BL_DG.

A boundary peripheral gate PR_GE may extend in the second direction D2 and in parallel with the outermost dummy bit-line BL_DA. The boundary peripheral gate PR_GE may be disposed at a boundary between the cell area separation film 22 and the peripheral area 24. Unlike the drawings, in the semiconductor memory device according to some example embodiments, the boundary peripheral gate PR_GE may extend in the first direction D1. Further, the semiconductor memory device according to some embodiments may not include the boundary peripheral gate PR_GE.

A semiconductor memory device according to some example embodiments may include various contact arrangements formed on the cell active area ACT. The various contact arrangements may include, for example, a direct contact DC, a buried contact BC, and a landing pad LP, etc.

In this regard, the direct contact DC may mean a contact that electrically connects the cell active area ACT to the bit-line BL. The buried contact BC may mean a contact connecting the cell active area ACT to a lower electrode (e.g., 191 in FIG. 6 and FIG. 9) of a capacitor. In terms of an arrangement structure, a contact area between the buried contact BC and the cell active area ACT may be small. Accordingly, a conductive landing pad LP may be introduced to expand the contact area between the cell active area ACT and the buried contact BC, and to expand the contact area between the buried contact BC and the lower electrode (191 in FIG. 6 and FIG. 9) of the capacitor.

The landing pad LP may be disposed between the cell active area ACT and the buried contact BC and may be disposed between the buried contact BC and the lower electrode (191 in FIG. 6 and FIG. 9) of the capacitor. In the semiconductor memory device according to some example embodiments, the landing pad LP may be disposed between the buried contact BC and the lower electrode of the capacitor. Expanding the contact area via the introduction of the landing pad LP may allow a contact resistance between the cell active area ACT and the lower electrode of the capacitor to be reduced.

The direct contact DC may be connected to the bit-line connection area 103*a*. The buried contact BC may be connected to the storage connection area 103*b*. As the buried contact BC is dispose in each of both opposing ends of the cell active area ACT, the landing pad LP may be disposed adjacent to each of both opposing ends of the cell active area ACT and partially overlap with the buried contact BC. In other words, the buried contact BC may be formed to overlap the cell active area ACT and the cell element isolation film (e.g., 105 in FIG. 6) between adjacent word-lines WL and between adjacent bit-lines BL.

The word-line WL may be formed as a structure buried in the substrate 100. The word-line WL may extend across the cell active area ACT between the direct contacts DC or between the buried contacts BC. As shown, two word-lines WL may extend through one cell active area ACT. As the cell active area ACT extends along the third direction D3, the extension direction of the word-line WL may have an angle smaller than 90 degrees with respective to the extension direction of the cell active area ACT.

The direct contacts DC and the buried contacts BC may be arranged in a symmetrical or substantially symmetrical manner. Accordingly, the direct contacts DC and the buried contacts BC may be arranged in a straight or substantially straight line along the first direction D1 and the second direction D2. Unlike the direct contact DC and the buried contact BC, the landing pads LP may be arranged in a zigzag manner in the second direction D2 which the bit-line BL extends. Further, the landing pads LP may overlap with the same portion of a side face of each bit-line BL in the first direction D1 in which the word-line WL extends. For example, each of landing pads LP in a first line may overlap the left side face of a corresponding bit-line BL, while each of the landing pads LP in a second line may overlap with a right side face of the corresponding bit-line BL.

Referring to FIG. 1 to FIG. 9, the semiconductor memory device according to some example embodiments may include a plurality of cell gate structures 110, a plurality of cell conductive lines 140N, 140DA, and 140DB, a plurality of storage pads 160, information storage 190, and a peripheral gate conductive film 240.

The substrate 100 may include the cell area 20, the cell area separation film 22, and the peripheral area 24. The substrate 100 may be a silicon substrate, an SOI (silicon-on-insulator), etc. Alternatively, the substrate 100 may include silicon germanium, SGOI (silicon germanium on insulator), indium antimonide, lead tellurium compound, indium arsenic, indium phosphide, gallium arsenide or gallium antimonide. However, the present inventive concepts are not limited thereto.

The plurality of cell gate structures 110, the plurality of cell conductive lines 140N, 140DA, and 140DB, the plurality of storage pads 160, and the information storage 190 may be disposed in the cell area 20. The peripheral gate structure 240 may be disposed in the peripheral area 24.

A cell element isolation film 105 may be formed in the substrate 100 and in the cell area 20. The cell element isolation film 105 may have an STI (shallow trench isolation) structure with excellent element isolation ability. The cell element isolation film 105 may define the cell active area ACT within the cell area 20. The cell active area ACT defined by the cell element isolation film 105 may have an elongate island shape including a minor axis and a major axis as shown in FIG. 2 to FIG. 5. The cell active area ACT may have a diagonally extension shape to have an angle of smaller than 90 degrees with respect to the extension direction of the word-line WL horizontally flush with the cell element isolation film 105. Further, the cell active area ACT may have a diagonally extension shape to have an angle of smaller than 90 degrees with respect to an extension direction of the bit-line BL formed on the cell element isolation film 105.

The cell area separation film 22 may be embodied as a cell boundary separation film having an STI structure. The cell area 20 may be defined by the cell area separation film 22.

Each of the cell element isolation film 105 and the cell area separation film 22 may include, for example, at least one of a silicon oxide film, a silicon nitride film, and a silicon oxynitride film. However, the present inventive concepts are not limited thereto. In FIG. 6 to FIG. 9, each of the cell element isolation film 105 and the cell area separation film 22 is shown to be formed as a single insulating film. However, this is only for convenience of illustration, and the present inventive concepts are not limited thereto. Depending on a width of each of the cell element isolation film 105 and the cell area separation film 22, each of the cell element isolation film 105 and the cell area separation film 22 may be formed as a single insulating film, or as a stack of a plurality of insulating films.

In FIG. 6 and FIG. 8, a top face of the cell element isolation film 105, a top face of the substrate 100, and a top face of the cell area separation film 22 are shown to be horizontally flush with each other. However, this is only for convenience of illustration, and the present inventive concepts are not limited thereto.

The cell gate structure 110 may be formed in the substrate 100 and the cell element isolation film 105. The cell gate structure 110 may be formed along the cell element isolation film 105 and the cell active area ACT defined by the cell element isolation film 105.

The cell gate structure 110 may include a cell gate trench 115 formed in the substrate 100 and the cell element isolation film 105, a cell gate insulating film 111, a cell gate electrode 112, a cell gate capping pattern 113, and a cell gate capping conductive film 114. In this regard, the cell gate electrode 112 may act as the word-line WL. Unlike a configuration as shown, the cell gate structure 110 may not include the cell gate capping conductive film 114.

The cell gate insulating film 111 may extend along a side wall and a bottom face of the cell gate trench 115. The cell gate insulating film 111 may extend along a profile of at least a portion of the cell gate trench 115. The cell gate insulating film 111 may include, for example, at least one of silicon oxide, silicon nitride, silicon oxynitride, or high dielectric constant materials having a higher dielectric constant than that of silicon oxide. The high dielectric constant material may include, for example, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and combinations thereof, but example embodiments are not limited thereto.

The cell gate electrode 112 may be formed on the cell gate insulating film 111. The cell gate electrode 112 may fill a portion of the cell gate trench 115. The cell gate capping conductive film 114 may extend along a top face of the cell gate electrode 112.

The cell gate electrode 112 may include at least one of metal, metal alloy, conductive metal carbonitride, conductive metal carbide, metal silicide, doped semiconductor material, conductive metal oxynitride, and conductive metal oxide but example embodiments are not limited thereto. The cell gate electrode 112 may include at least one of, for example, TiN, TaC, TaN, TiSiN, TaSiN, TaTiN, TiAlN, TaAlN, WN, Ru, TiAl, TiAlC—N, TiAlC, TiC, TaCN, W, Al, Cu, Co, Ti, Ta, Ni, Pt, Ni—Pt, Nb, NbN, NbC, Mo, MoN, MoC, WC, Rh, Pd, Ir, Ag, Au, Zn, V, RuTiN, TiSi, TaSi, NiSi, CoSi, IrOx, RuOx, and combinations thereof. However, the present inventive concepts are not limited thereto. The cell gate capping conductive film 114 may include, for example, polysilicon or polysilicon germanium. However, the present inventive concepts are not limited thereto.

The cell gate capping pattern 113 may be disposed on the cell gate electrode 112 and the cell gate capping conductive film 114. The cell gate capping pattern 113 may fill a remaining portion of the cell gate trench 115 except for the cell gate electrode 112 and the cell gate capping conductive film 114. The cell gate insulating film 111 is shown to extend along a side wall of the cell gate capping pattern 113. However, the present inventive concepts are not limited thereto. The cell gate capping pattern 113 may include, for example, at least one of silicon nitride SiN, silicon oxynitride SiON, silicon oxide $SiO_2$, silicon carbonitride SiCN, silicon oxycarbonitride SiOCN, and combinations thereof.

Although not shown, an impurity doped area may be formed on at least one side of the cell gate structure 110. The impurity doped area may act as a source/drain area of the transistor. The impurity doped area may be formed in the storage connection area 103b and the bit-line connection area 103a of FIG. 3.

The bit-line structure may include cell conductive lines 140N, 140DA, and 140DB and a cell line capping film 144. The cell conductive lines 140N, 140DA, and 140DB may be formed on the substrate 100 including the cell gate structure 110, and on the cell element isolation film 105 formed in the substrate 100. The cell conductive lines 140N, 140DA, and 140DB may intersect a cell element isolation film 105, and the cell active area ACT defined by the cell element isolation film 105. The cell conductive lines 140N, 140DA, and 140DB may be formed to intersect with the cell gate structure 110. In this regard, the cell conductive lines 140N, 140DA, and 140DB may act as the bit-lines BL.

The cell conductive lines 140N, 140DA, and 140DB may include a normal cell conductive line 140N and dummy cell conductive lines 140DA and 140DB. The dummy cell conductive lines 140DA and 140DB may include a first outermost dummy cell conductive line 140DA and an inner dummy cell conductive line 140DB. The normal cell conductive line 140N may act as the normal bit-line BL_N. The first outermost dummy cell conductive line 140DA may act as the outermost dummy bit-line BL_DA. The inner dummy cell conductive line 140DB may act as the inner dummy bit-line BL_DB.

Each of the cell conductive lines 140N, 140DA, and 140DB may include a stack of multiple films. Each of the cell conductive lines 140N, 140DA, and 140DB may include, for example, a first cell conductive film 141, a second cell conductive film 142, and a third cell conductive film 143. The first to third cell conductive films 141, 142, and 143 may be sequentially stacked on the substrate 100 and the cell element isolation film 105. Although each of the cell conductive lines 140N, 140DA, and 140DB is shown to be composed of the three films, the present inventive concepts are not limited thereto.

Each of the first to third cell conductive films 141, 142, and 143 may include, for example, at least one of a semiconductor material doped with impurities, a conductive silicide compound, a conductive metal nitride metal, and a metal alloy, but example embodiments are note limited thereto. For example, the first cell conductive film 141 may include a doped semiconductor material. The first cell conductive film 141 may be a semiconductor conductive line. The second cell conductive film 142 may include at least one of the conductive silicide compound and the conductive metal nitride. The third cell conductive film 143 may include at least one of metal and metal alloy. However, the present inventive concepts are not limited thereto. Each of the second and third cell conductive films 142 and 143 may be a metallic conductive line.

The normal cell conductive line 140N may have a first width W1 in the first direction D1. The first outermost dummy cell conductive line 140DA may have a second width W21 in the first direction D1. The inner dummy cell conductive line 140DB may have a third width W22 in the first direction D1.

In this regard, the width W1 of the normal cell conductive line 140N, the width W21 of the first outermost dummy cell conductive line 140DA, and the width W22 of the inner dummy cell conductive line 140DB may respectively refer to widths of bottom faces of the normal cell conductive line 140N, the first outermost dummy cell conductive line 140DA, and the inner dummy cell conductive line 140DB. That is, the width W1 of the normal cell conductive line 140N, the width W21 of the first outermost dummy cell conductive line 140DA, and the width W22 of the inner dummy cell conductive line 140DB may be a width of a bottom face of the first cell conductive film 141 facing the substrate 100.

The width W1 of the normal cell conductive line 140N may be a width of the normal bit-line BL_N. The width W21 of the first outermost dummy cell conductive line 140DA may be a width of the outermost dummy bit-line BL_DA. The width W22 of the inner dummy cell conductive line 140DB may be a width of the inner dummy bit-line BL_DB.

For example, the width W22 of the inner dummy cell conductive line 140DB is equal or substantially equal to the width W1 of the normal cell conductive line 140N. In the semiconductor memory device according to some example embodiments, the width W21 of the first outermost dummy cell conductive line 140DA may be equal or substantially equal to the width W22 of the inner dummy cell conductive line 140DB. Each of the widths W21 and W22 of the dummy cell conductive lines 140DA and 140DB may be equal or substantially equal to the width W1 of the normal cell conductive line 140N.

A ratio of each of the widths W21 and W22 of the dummy cell conductive lines 140DA and 140DB to the width W1 of the normal cell conductive line 140N may be 1. That is, a ratio W21/W1 of the width W21 of the first outermost dummy cell conductive line 140DA to the width W1 of the normal cell conductive line 140N may be 1. A ratio W22/W1 of the width W22 of the inner dummy cell conductive line 140DB to the width W1 of the normal cell conductive line 140N may be 1.

For example, the width W1 of the normal cell conductive line 140N may be in a range from 5 nm to 25 nm. Similarly, each of the widths W21 and W22 of the dummy cell conductive lines 140DA and 140DB may be in a range from 5 nm to 25 nm.

A bit-line contact 146 may be formed between the cell conductive lines 140N, 140DA, and 140DB and the substrate 100. That is, the cell conductive lines 140N, 140DA, and 140DB may be formed on the bit-line contact 146. For example, the bit-line contact 146 may be formed at a point where each of the cell conductive lines 140N, 140DA, and 140DB intersects a center portion of the cell active area ACT having an elongate island shape. The bit-line contact 146 may be formed between the bit-line connection area 103a of the cell active area ACT and the cell conductive lines 140N, 140DA, and 140DB. The bit-line contact 146 may be connected to the bit-line connection area 103a.

The plurality of bit-line contacts 146 may extend along the second direction D2. Each of the cell conductive lines 140N, 140DA, and 140DB may be disposed on the plurality of bit-line contacts 146 and extend along the second direction D2.

The bit-line contact 146 may electrically connect the cell conductive lines 140N, 140DA, and 140DB to the substrate 100. In this regard, the bit-line contact 146 may act as the direct contact DC. The bit-line contact 146 may include, for example, at least one of a semiconductor material doped with impurities, a conductive silicide compound, a conductive metal nitride, and a metal, but example embodiments are not limited thereto. In the semiconductor memory device according to some example embodiments, the bit-line contact 146 may include a semiconductor material doped with impurities.

In FIG. 8 in which the normal cell conductive line 140N is shown, in an area overlapping a top face 146US of the bit-line contact, the normal cell conductive line 140N may include the second cell conductive film 142 and the third cell conductive film 143. In an area that does not overlap with the top face 146US of the bit-line contact, the normal cell conductive line 140N may include the first to third cell conductive films 141, 142, and 143.

Although not shown, the dummy cell conductive line 140DA and 140DB may have the same or substantially the same structure as that of the normal cell conductive line 140N.

The second cell conductive film 142 may extend along a top face 141US of the first cell conductive film and a top face 146US of the bit-line contact. A bottom face 142BS of the second cell conductive film may face toward the top face 141US of the first cell conductive film and the top face 146US of the bit-line contact.

The bottom face 142BS of the second cell conductive film may directly contact the top face 141US of the first cell conductive film and the top face 146US of the bit-line contact. A vertical dimension from a top face of the substrate 100 to the bottom face 142BS of the second cell conductive film may be the same or substantially the same as a vertical dimension from the top face of the substrate 100 to the top face 146US of the bit-line contact. For example, the vertical dimension from the top face of the substrate 100 to the top face 141US of the first cell conductive film may be the same or substantially the same as the vertical dimension from the top face of the substrate 100 of the top face 146US of the bit-line contact.

The plurality of bit-line contacts 146 may include a first bit-line contact, a second bit-line contact and a third bit-line contact under one cell conductive line 140N, 140DA, or 140DB. The first to third bit-line contacts may be sequentially arranged from the cell area separation film 22 in the second direction D2. The second bit-line contact may be disposed between the first bit-line contact and the third bit-line contact. In the semiconductor memory device according to some embodiments, the bottom face 142BS of the second cell conductive film may directly contact a top face 146US of the first bit-line contact, a top face 146US of the second bit-line contact, and a top face 146US of the third bit-line contact.

In FIG. 8, it is illustrated that the bit-line contact 146 is not disposed between the substrate 100 and the normal cell conductive line 140N closest to the cell area separation film 22. The present inventive concepts are not limited thereto. Unlike the illustration, the bit-line contact 146 may be disposed between the substrate 100 and the normal cell conductive line 140N closest to the cell area separation film 22.

The cell line capping film 144 may be disposed on the cell conductive lines 140N, 140DA, and 140DB. The cell line capping film 144 may extend in the second direction D2 and along the top faces of the cell conductive lines 140N, 140DA, and 140DB. In this case, the cell line capping film 144 may include, for example, at least one of a silicon nitride, a silicon oxynitride, a silicon carbonitride, and a silicon oxycarbonitride, but example embodiments are not limited thereto. In the semiconductor memory device according to some example embodiments, the cell line capping film 144 may include, for example, a silicon nitride film. Although the cell line capping film 144 is shown to be a single film, the present inventive concepts are not limited thereto.

A cell insulating film 130 may be formed on the substrate 100 and the cell element isolation film 105. More specifically, the cell insulating film 130 may be disposed on a portion of the substrate 100 and a portion of the cell element isolation film 105 on which the bit-line contact 146 has not been formed. The cell insulating film 130 may be disposed between the substrate 100 and the cell conductive line 140 and between the cell element isolation film 105 and the cell conductive lines 140N, 140DA, and 140DB.

The cell insulating film 130 may be a single film. However, as illustrated, the cell insulating film 130 may be a stack of multi-films including the first cell insulating film 131 and the second cell insulating film 132. For example, the first cell insulating film 131 may include a silicon oxide film, and the second cell insulating film 132 may include a silicon nitride film. The present inventive concepts are not limited thereto. Unlike the configuration as shown, the cell insulating film 130 may include three or more insulating films.

A cell buffer film 101 may be disposed between the cell insulating film 130 and the cell area separation film 22. Although cell buffer film 101 may include, for example, a silicon oxide film, the present inventive concepts are not limited thereto.

A cell line spacer 150 may be disposed on sidewalls of the cell conductive lines 140N, 140DA, and 140DB, and the cell line capping film 144. In portions of the cell conductive lines 140N, 140DA, and 140DB where the bit-line contact 146 is formed, the cell line spacer 150 may be formed on the substrate 100 and the cell element isolation film 105. The cell line spacer 150 may be disposed on sidewalls of the cell conductive lines 140N, 140DA, and 140DB, the cell line capping film 144 and the bit-line contact 146.

In remaining portions of the cell conductive lines 140N, 140DA, and 140DB where the bit-line contact 146 is not formed, the cell line spacer 150 may be disposed on the cell insulating film 130. The cell line spacer 150 may be disposed on the sidewalls of the cell conductive lines 140N, 140DA, and 140DB, and the cell line capping film 144.

The cell line spacer 150 may be a single layer. However, as illustrated, the cell line spacer 150 may be a stack of multi-films including the first to fourth cell line spacers 151, 152, 153, and 154. For example, each of the first to fourth cell line spacers 151, 152, 153, and 154 may include one of a silicon oxide film, a silicon nitride film, a silicon oxynitride film (SiON), a silicon oxycarbonitride film (SiOCN), air, and combinations thereof. However, the present inventive concepts are not limited thereto.

For example, the second cell line spacer 152 may not be disposed on the cell insulating film 130, but may be disposed on a sidewall of the bit-line contact 146. The cell line spacer 150 may be disposed on a long sidewall extending in the second direction D2 among sidewalls of the cell conductive lines 140N, 140DA, and 140DB.

A fence pattern 170 may be disposed on the substrate 100 and the cell element isolation film 105. The fence pattern 170 may be formed to overlap the cell gate structure 110 formed in the substrate 100 and the cell element isolation film 105. The fence pattern 170 may be disposed between the cell conductive lines 140N, 140DA, and 140DB extending in the second direction D2. The fence pattern 170 may include, for example, at least one of silicon oxide, silicon nitride, silicon oxynitride, and a combination thereof, but example embodiments are not limited thereto.

A plurality of storage contacts 120 may be disposed between the cell conductive lines 140N, 140DA, and 140DB adjacent to each other in the first direction D1. The storage contact 120 may be disposed between the fence patterns 170 adjacent to each other in the second direction D2. The storage contact 120 may overlap portions of the substrate 100 and the cell element isolation film 105 between the adjacent cell conductive lines 140N, 140DA, and 140DB. The storage contact 120 may be connected to the storage connection area 103b of the cell active area ACT. In this regard, the storage contact 120 may act as the buried contact BC.

The plurality of storage contacts 120 may be arranged along the first direction D 1. In the semiconductor memory device according to some example embodiments, the plurality of storage contacts 120 may not include an air gap.

The storage contact 120 may include, for example, at least one of a semiconductor material doped with impurities, a conductive silicide compound, a conductive metal nitride, and a metal, but example embodiments are not limited thereto. In the semiconductor memory device according to some example embodiments, the storage contact 120 may include a semiconductor material doped with impurities.

The storage pad 160 may be disposed on each storage contact 120. The storage pad 160 may be electrically connected to the storage contact 120. The storage pad 160 may be connected to the storage connection area 103b of the cell active area ACT. In this regard, the storage pad 160 may act as the landing pad LP.

The storage pad 160 may overlap a portion of a top face of each of the cell conductive lines 140N, 140DA, and 140DB. The storage pad 160 may include, for example, at least one of a semiconductor material doped with impurities, a conductive silicide compound, a conductive metal nitride, a conductive metal carbide, a metal, and a metal alloy, but example embodiments are not limited thereto.

A pad separation insulating film 180 may be formed on the storage pad 160 and the cell conductive lines 140N, 140DA, and 140DB. For example, the pad separation insulating film 180 may be disposed on the cell line capping film 144. The pad separation insulating film 180 may separate the storage pads 160 constituting a plurality of isolated areas from each other. The pad separation insulating film 180 may not cover a top face 160US of the storage pad. The pad separation insulating film 180 may fill a pad separation recess. The pad separation recess may separate adjacent storage pads 160 from each other.

The pad separation insulating film 180 may include an insulating material, and may electrically separate the plurality of storage pads 160 from each other. For example, the pad separation insulating film 180 may include, for example, at least one of a silicon oxide film, a silicon nitride film, a silicon oxynitride film, a silicon oxycarbonitride film, and a silicon carbonitride film. The present inventive concepts are not limited thereto.

The peripheral gate structure may be disposed on the substrate 100 and in the peripheral area 24. The peripheral gate structure may be disposed on a peripheral active area defined by a peripheral element isolation film. The peripheral gate structure may be formed in the peripheral area 24, and may be included in a peripheral circuit for controlling a memory cell formed in the cell area 20.

The peripheral gate structure may include a peripheral gate insulating film 230, a peripheral gate conductive film 240, and a peripheral capping film 244 sequentially stacked on the substrate 100. The peripheral gate structure may include a peripheral spacer 245 disposed on a sidewall of the peripheral gate conductive film 240 and a sidewall of the peripheral capping film 244.

The boundary peripheral gate PR_GE shown in FIG. 4 may include the peripheral gate conductive film 240. That is, the peripheral gate structure of the peripheral area 24 may include the peripheral gate insulating film 230, the peripheral gate conductive film 240, the peripheral capping film 244, and the peripheral spacer 245 as shown in FIG. 6.

The peripheral gate conductive film 240 may include first to third peripheral conductive films 241, 242, and 243 sequentially stacked on the peripheral gate insulating film 230. In one example, an additional conductive film may not be disposed between the peripheral gate conductive film 240 and the peripheral gate insulating film 230. In another example, unlike a configuration as shown, an additional conductive film such as a work function conductive film may be disposed between the peripheral gate conductive film 240 and the peripheral gate insulating film 230.

The peripheral gate conductive film 240 may have the same or substantially the same stack structure as that of each of the cell conductive lines 140N, 140DA, and 140DB. The first peripheral conductive film 241 may include the same or substantially the same material as that of the first cell conductive film 141. The second peripheral conductive film 242 may include the same or substantially the same material as that of the second cell conductive film 142. The third peripheral conductive film 243 may include the same or substantially the same material as that of the third cell conductive film 143.

The peripheral gate insulating film 230 may include, for example, silicon oxide, silicon nitride, silicon oxynitride, or a high dielectric constant material having a higher dielectric constant than that of silicon oxide. The peripheral spacer 245 may include, for example, at least one of silicon nitride, silicon oxynitride, silicon oxide, silicon carbonitride, silicon oxycarbonitride, and combinations thereof. The peripheral capping film 244 may include, for example, at least one of a silicon nitride film, a silicon oxynitride, and a silicon oxide. However, example embodiments are not limited to these materials.

A lower etch stop film 250 may be disposed on the substrate 100. The lower etch stop film 250 may be formed along a profile of the peripheral gate structure. The lower etch stop film 250 may be disposed on the sidewalls of the cell conductive lines 140N, 140DA, and 140DB extending in the first direction D1. The lower etch stop film 250 may extend along a long sidewall of the first outermost dummy cell conductive line 140DA extending in the second direction D2. The lower etch stop film 250 may include, for example, at least one of a silicon nitride, a silicon oxynitride, a silicon carbonitride, and a silicon oxycarbonitride, but example embodiments are not limited thereto.

The lower peripheral interlayer insulating film 290 may be disposed on the lower etch stop film 250. The lower peripheral interlayer insulating film 290 may be disposed on the cell area separation film 22 and between the first outermost dummy cell conductive line 140DA and the peripheral gate conductive film 240.

The lower peripheral interlayer insulating film 290 may include an oxide-based insulating material. A top face of the lower peripheral interlayer insulating film 290 may be coplanar with the lower etch stop film 250 extending along a top face of the peripheral capping film 244.

An upper peripheral interlayer insulating film 291 is disposed on the peripheral gate conductive film 240 and a lower peripheral interlayer insulating film 290. The upper peripheral interlayer insulating film 291 may cover the lower etch stop film 250 and the lower peripheral interlayer insulating film 290.

The upper peripheral interlayer insulating film 291 may include a material different from that of the lower peripheral interlayer insulating film 290. The upper peripheral interlayer insulating film 291 may include, for example, a nitride-based insulating material. For example, the upper peripheral interlayer insulating film 291 may include silicon nitride.

A peripheral wire line 265 may be disposed on the upper peripheral interlayer insulating film 291. The peripheral wire line 265 may connect a peripheral circuit formed in the peripheral area 24 and a memory cell formed in the cell area 20 to each other.

A bit-line contact plug 261 may extend through the upper peripheral interlayer insulating film 291 and the cell line capping film 144 and may be connected to the normal cell conductive line 140N. The bit-line contact plug 261 may be connected to a peripheral circuit formed in the peripheral area 24.

In one example, the bit-line contact plug 261 may not be connected to the dummy cell conductive lines 140DA and 140DB. That is, the bit-line contact plug 261 connected to the dummy cell conductive lines 140DA and 140DB may not be formed on the dummy cell conductive lines 140DA and 140DB. In another example, the bit-line contact plug 261 may be connected to the dummy cell conductive lines 140DA and 140DB. However, the bit-line contact plug 261 connected to the dummy cell conductive lines 140DA and 140DB may not be connected to the peripheral circuit formed in the peripheral area 24. Alternatively, the bit-line contact plug 261 connected to the dummy cell conductive lines 140DA and 140DB may not be connected to a voltage source or a current source.

The peripheral wire line 265 and the bit-line contact plug 261 may include the same or substantially the same material as that of the storage pad 160. However, the present inventive concepts are not limited thereto. The peripheral wire line 265 and the bit-line contact plug 261 may be formed at the same vertical level at which the storage pad 160 is formed. However, the present inventive concepts are not limited thereto. In this regard, the phrase "being formed at the same vertical level as" may mean being manufactured in the same or substantially the same manufacturing process. A top face 265US of the peripheral wire line and a top face of the bit-line contact plug 261 may be coplanar or substantially coplanar with the top face 160US of the storage pad.

An upper etch stop film 295 may be disposed on the storage pad 160, the pad separation insulating film 180, the peripheral wire line 265, and the bit-line contact plug 261. The upper etch stop film 195 may extend to the cell area 20 and also to the peripheral area 24. The upper etch stop film 195 may include at least one of a silicon nitride film, a silicon carbonitride film, a silicon boron nitride film (SiBN), a silicon oxynitride film, and a silicon oxycarbide film, but example embodiments are not limited thereto.

The information storage 190 may be disposed on the storage pad 160. The information storage 190 may be electrically connected to the storage pad 160. A portion of the information storage 190 may be disposed in the upper etch stop film 295. Although the information storage 190 may include, for example, a capacitor, the present inventive concepts are not limited thereto. The information storage 190 includes a lower electrode 191 and a capacitor dielectric film 192, and an upper electrode 193. For example, the upper electrode 193 may be a plate upper electrode having a plate shape. Although the upper electrode 193 is illustrated as being composed of a single film, it is only for convenience of illustration. The present inventive concepts are not limited thereto.

The lower electrode 191 may be disposed on the storage pad 160. Although the lower electrode 191 is shown to have a pillar shape, the present inventive concepts are not limited thereto. In another example, the lower electrode 191 may have a cylindrical shape. The capacitor dielectric film 192 is formed on the lower electrode 191. The capacitor dielectric film 192 may be formed along a profile of the lower electrode 191. The upper electrode 193 is formed on the capacitor dielectric film 192. The upper electrode 193 may surround an outer sidewall of the lower electrode 191.

In one example, the capacitor dielectric film 192 may be disposed at a portion overlapping the upper electrode 193 in the fourth direction D4. In another example, unlike a configuration as illustrated, the capacitor dielectric film 192 may include a first portion overlapping the upper electrode 193 in the fourth direction D4, and a second portion not overlapping the upper electrode 193 in the fourth direction D4. That is, the second portion of the capacitor dielectric film 192 is not covered with the upper electrode 193.

Each of the lower electrode 191 and the upper electrode 193 may include, for example, a doped semiconductor material, a conductive metal nitride (such as titanium nitride, tantalum nitride, niobium nitride, or tungsten nitride), a metal (such as ruthenium, iridium, or titanium. or tantalum, etc.), and a conductive metal oxide (such as iridium oxide or niobium oxide, etc.). The present inventive concepts are not limited thereto.

Although the capacitor dielectric film 192 may include, for example, one of silicon oxide, silicon nitride, silicon oxynitride and high dielectric constant material and combinations thereof, the present inventive concepts are not limited thereto. In the semiconductor memory device according to some example embodiments, the capacitor dielectric film 192 may include a stack structure in which layers made of zirconium oxide, aluminum oxide, and zirconium oxide are sequentially stacked. In the semiconductor memory device according to some example embodiments, the capacitor dielectric film 192 may include a dielectric film including hafnium (Hf). In the semiconductor memory device according to some example embodiments, the capacitor dielectric film 192 may have a stack structure of a ferroelectric material film and a paraelectric material film.

An interlayer insulating film 292 may be disposed on the upper etch stop film 295. The interlayer insulating film 292 may cover a sidewall of the upper electrode 193. The interlayer insulating film 292 may include an insulating material.

Figure 10:
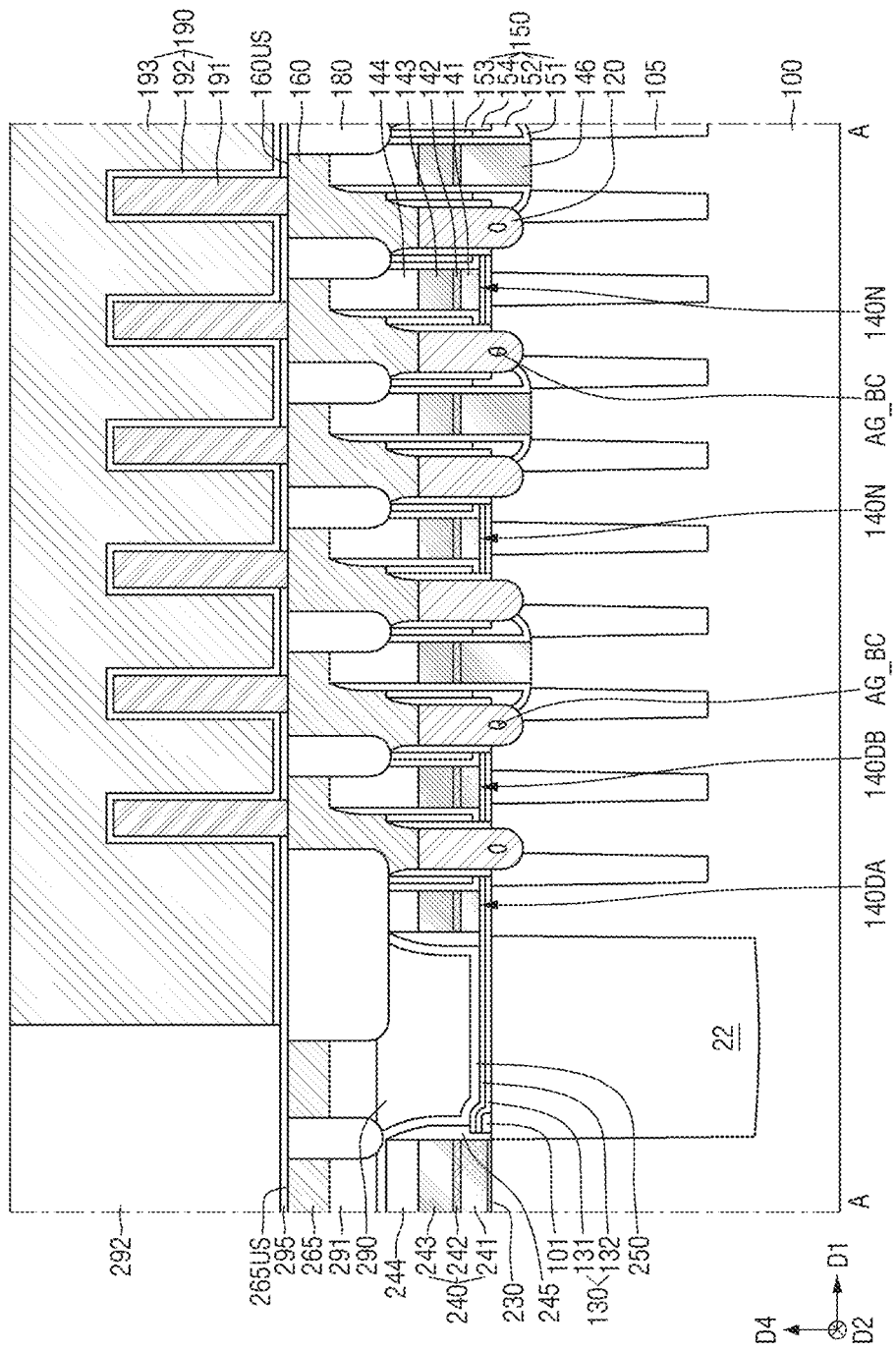
FIG. 10 is a diagram for illustrating a semiconductor memory device according to some example embodiments.

FIG. 10 is a diagram for illustrating a semiconductor memory device according to some example embodiments.

Figure 11:
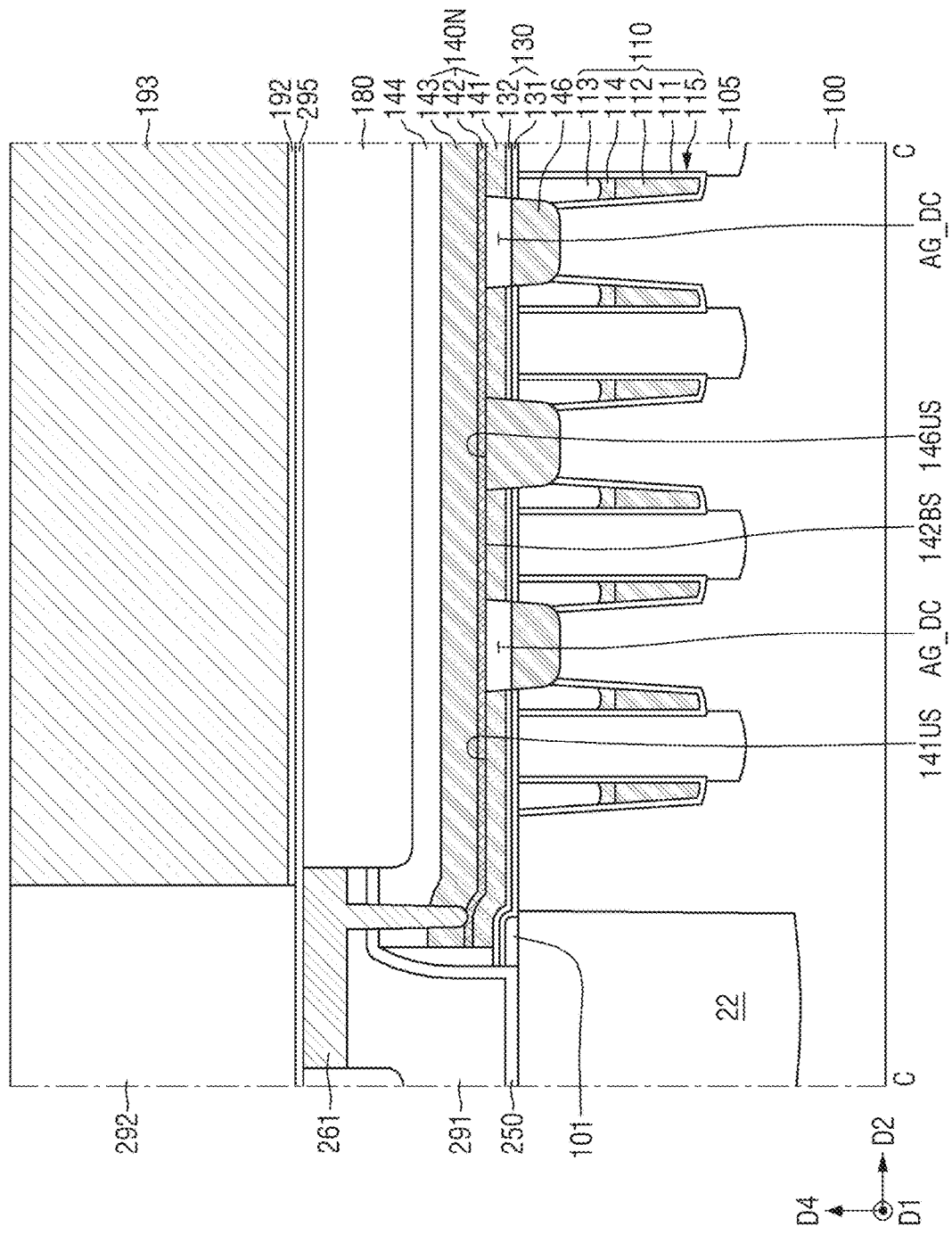
FIG. 11 is a diagram for illustrating a semiconductor memory device according to some example embodiments.

FIG. 11 is a diagram for illustrating a semiconductor memory device according to some example embodiments. For convenience of description, following description is based on differences thereof from those as described with reference to FIG. 1 to FIG. 9.

For reference, FIG. 10 is a cross-sectional view taken along A-A of FIG. 4, and FIG. 11 is a cross-sectional view taken along C-C of FIG. 5.

Referring to FIG. 10, in the semiconductor memory device according to some example embodiments, the storage contacts 120 respectively including first air gaps AG_BC may be arranged in a discrete manner.

For example, the plurality of storage contacts 120 may include a first storage contact, a second storage contact, and a third storage contact. The first storage contact, the second storage contact and the third storage contact may be sequentially arranged from the cell area separation film 22 and in the first direction D1. The second storage contact may be disposed between the first storage contact and the third storage contact.

For example, each of the first storage contact and the third storage contact may include the first airgap AG_BC. The second storage contact does not include the first airgap AG_BC. The second storage contact not including the first airgap AG_BC may be disposed between the first storage contact including the first airgap AG_BC and the third storage contact including the first airgap AG_BC.

The storage contacts 120 including the first airgap AG_BC may be arranged to be spaced from each other by a regular spacing. However, the present inventive concepts are not limited thereto.

It is shown that two second storage contacts that do not include the first airgap AG_BC are disposed between the first storage contact including the first airgap AG_BC and the third storage contact including the first airgap AG_BC. However, this is only for convenience of the description. The inventive concepts are not limited thereto.

Further, although it is illustrated that two storage contacts 120 including the first air gap AG_BC are arranged in a non-discrete manner, the present inventive concepts are not limited thereto.

Referring to FIG. 11, the semiconductor memory device according to some example embodiments may further include a second airgap AG_DC disposed between each of the cell conductive lines 140N, 140DA, and 140DB and the bit-line contact 146.

One of the cell conductive lines 140N, 140DA, and 140DB may be disposed on the plurality of bit-line contacts 146 arranged in the first direction D1. The plurality of bit-line contacts 146 may include the first bit-line contact, the second bit-line contact and the third bit-line contact under one of the cell conductive lines 140N, 140DA, and 140DB.

The first to third bit-line contacts may be sequentially arranged from the cell area separation film 22 in the second direction D2.

In FIG. 11 in which the normal cell conductive line 140N is shown, the second airgap AG_DC may be disposed between the first bit-line contact and the normal cell conductive line 140N, and between the third bit-line contact and the normal cell conductive line 140N. The second airgap AG_DC is not disposed between the second bit-line contact and the normal cell conductive line 140N.

The second airgaps AG_DC may be arranged in a discrete manner between one normal cell conductive line 140N and the plurality of bit-line contacts 146. Although it is illustrated that one second bit-line contact is disposed between the second airgaps AG_DCs, this is only for convenience of description. The inventive concepts are not limited thereto.

A vertical level of each of a top face 146US of the first bit-line contact in which the second airgap AG_DC is disposed and a top face 146US of the third bit-line contact in which the second airgap AG_DC is disposed may be lower than that of a top face 146US of the second bit-line contact in which the second airgap AG_DC is not disposed. Each of a vertical dimension from the top face of substrate 100 to the top face 146US of the first bit-line contact in which the second airgap AG_DC is disposed and a vertical dimension from the top face of substrate 100 to the top face 146US of the third bit-line contact in which the second airgap AG_DC is disposed may be smaller than a vertical dimension from the top face of substrate 100 to a bottom face 142BS of the second cell conductive film. Each of a vertical level of the top face 146US of the first bit-line contact in which the second airgap AG_DC is disposed and a vertical level of the top face 146US of the third bit-line contact in which the second airgap AG_DC is disposed may be lower than a vertical level of the top face 141US of the first cell conductive film.

In one example, the top face 146US of the first bit-line contact in which the second airgap AG_DC is disposed and the top face 146US of the third bit-line contact in which the second airgap AG_DC is disposed may not contact the bottom face 142BS of the second cell conductive film. Unlike a configuration shown, in another example, a portion of the top face 146US of the first bit-line contact in which the second airgap AG_DC is disposed, and a portion of the top face 146US of the third bit-line contact in which the second airgap AG_DC is disposed may contact the bottom face 142BS of the second cell conductive film.

In one example, the plurality of storage contacts 120 arranged along the first direction D1 may not include the first airgap (e.g., AG_BC in FIG. 10).

Figure 12:
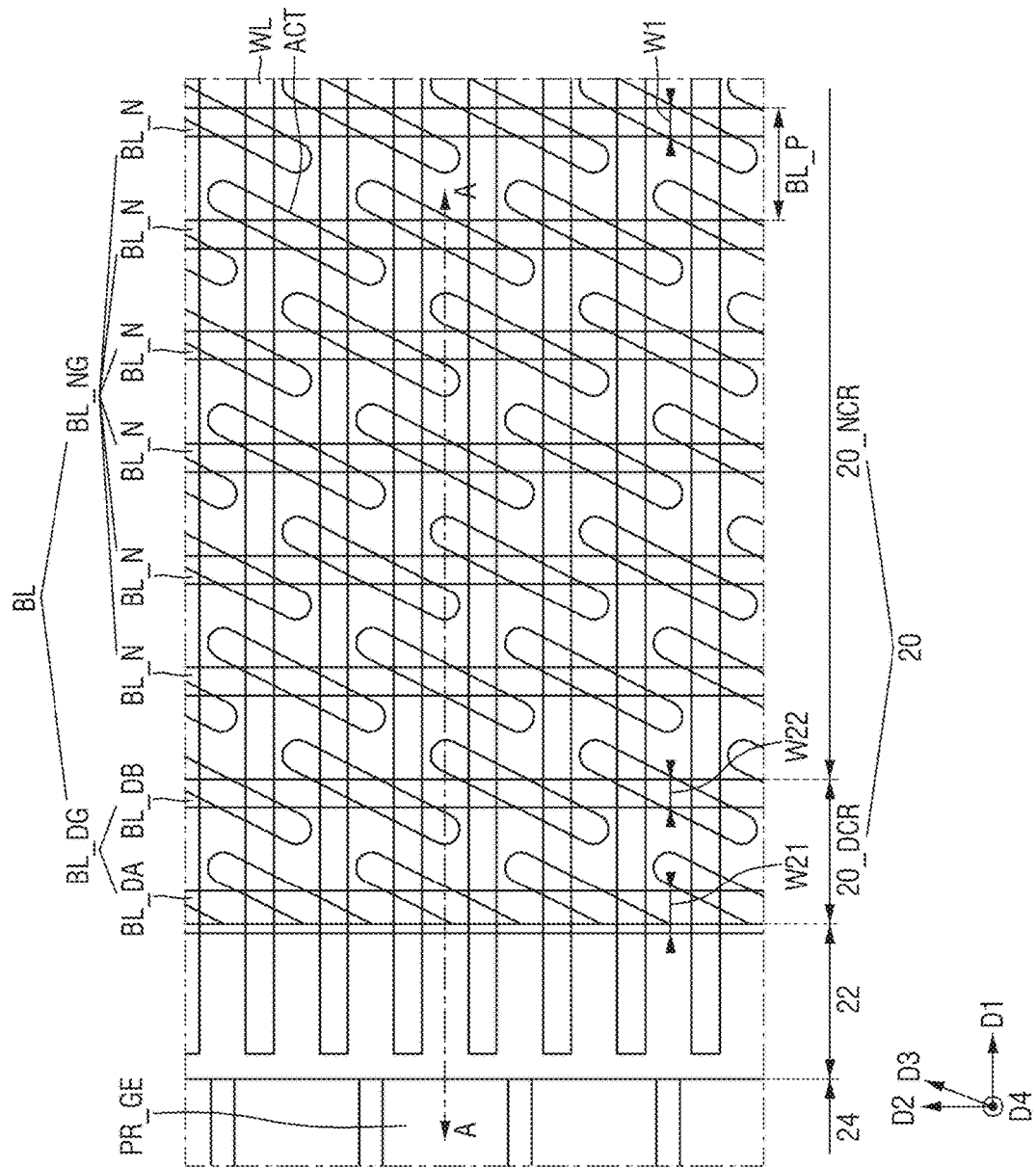
FIG. 12 is a schematic layout diagram of a semiconductor memory device according to some example embodiments.
Figure 13:
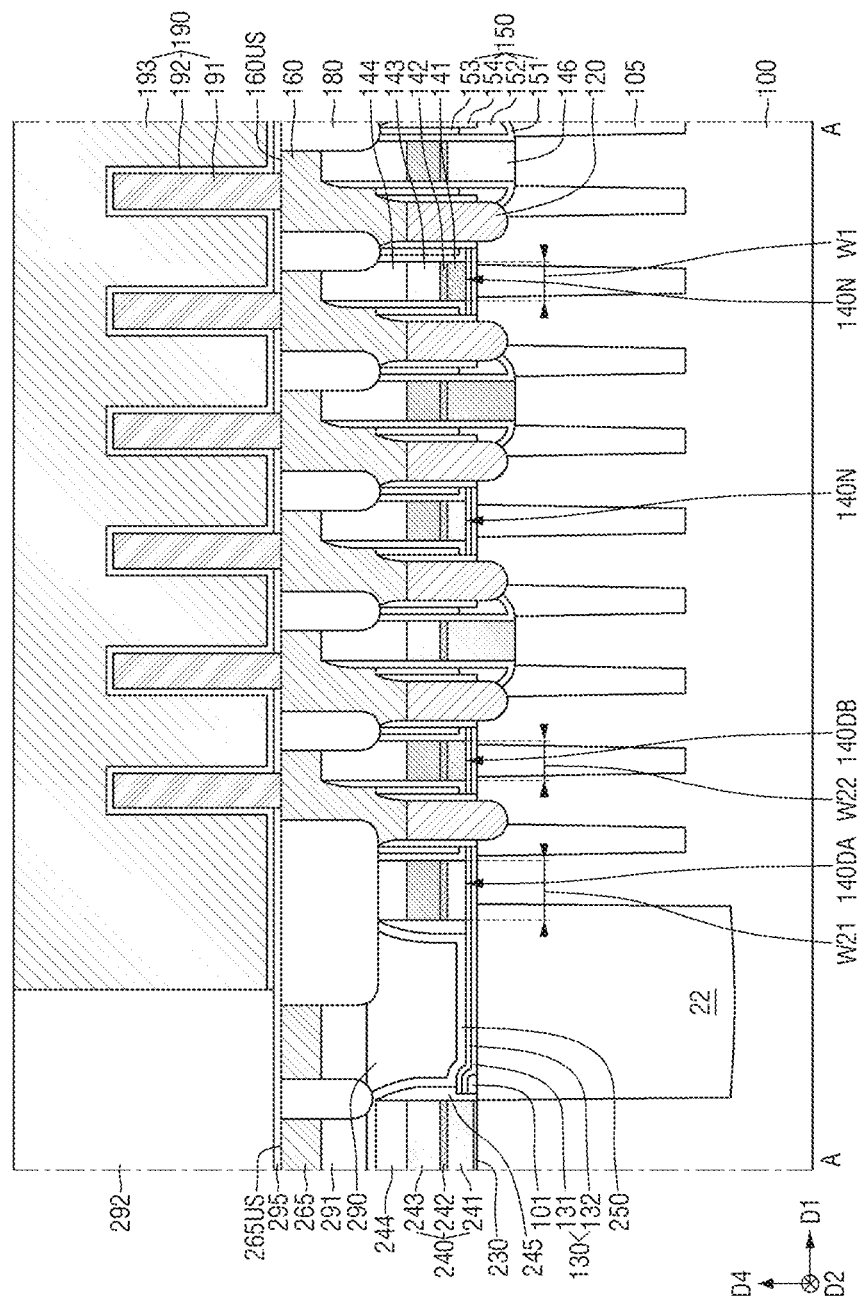
FIG. 13 is an illustrative cross-sectional view taken along A-A of FIG. 12.

FIG. 12 is a schematic layout diagram of a semiconductor memory device according to some example embodiments. FIG. 13 is an illustrative cross-sectional view taken along A-A of FIG. 12. For convenience of description, following descriptions are based on differences thereof from those described with reference to FIG. 1 to FIG. 9.

For reference, FIG. 12 is a schematic layout diagram of a R2 area in FIG. 1.

Referring to FIG. 12 and FIG. 13, in the semiconductor memory device according to some example embodiments, the width W21 of the first outermost dummy cell conductive line 140DA may be greater than the width W22 of the inner dummy cell conductive line 140DB.

The width W22 of the inner dummy cell conductive line 140DB may be equal or substantially equal to the width W1 of the normal cell conductive line 140N.

The ratio of each of the widths W21 and W22 of the dummy cell conductive lines 140DA and 140DB to the width W1 of the normal cell conductive line 140N may be in a range from 1 to 2.

For example, the ratio W21/W1 of the width W21 of the first outermost dummy cell conductive line 140DA to the width W1 of the normal cell conductive line 140N may be in a range from 1 exclusive to 2 inclusive. The ratio W22/W1 of the width W22 of the inner dummy cell conductive line 140DB to the width W1 of the normal cell conductive line 140N may be 1. The ratio W21/W22 of the width W21 of the first outermost dummy cell conductive line 140DA to the width W22 of the inner dummy cell conductive line 140DB may be in a range from 1 exclusive to 2 inclusive.

For example, the width W1 of the normal cell conductive line 140N may be in a range from 5 nm to 25 nm. Each of the widths W21 and W22 of the dummy cell conductive lines 140DA and 140DB may be smaller than or equal to 30 nm.

For example, each of the widths W21 and W22 of the dummy cell conductive lines 140DA and 140DB may be in a range from 5 nm to 30 nm. The width W22 of the inner dummy cell conductive line 140DB may be in a range from 5 nm to 25 nm. The width W21 of the first outermost dummy cell conductive line 140DA may be in a range from 5 nm to 30 nm.

In another example, a ratio of each of the widths W21 and W22 of the dummy cell conductive lines 140DA and 140DB to the width W1 of the normal cell conductive line 140N may be in a range from 1 inclusive to 1.7 inclusive. The ratio W21/W22 of the width W21 of the first outermost dummy cell conductive line 140DA to the width W22 of the inner dummy cell conductive line 140DB may be in a range from 1 exclusive to 1.7 inclusive.

In another example, the ratio of each of the widths W21 and W22 of the dummy cell conductive lines 140DA and 140DB to the width W1 of the normal cell conductive line 140N may be in a range from 1 inclusive to 1.5 inclusive. The ratio W21/W22 of the width W21 of the first outermost dummy cell conductive line 140DA to the width W22 of the inner dummy cell conductive line 140DB may be in a range from 1 exclusive to 1.5 inclusive. Description thereof will be described later with reference to FIG. 24 to FIG. 27.

Figure 14:
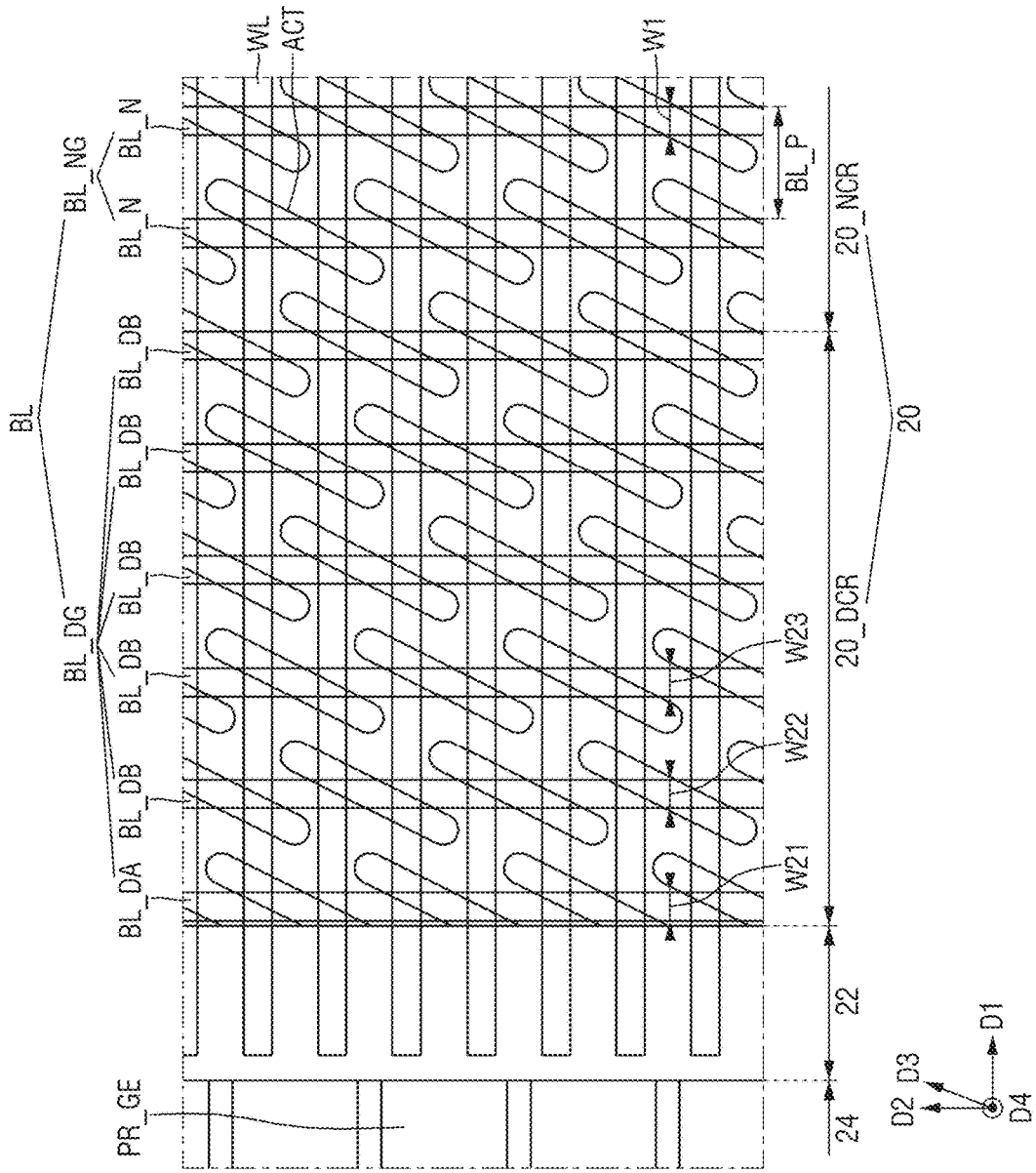
FIG. 14 is a schematic layout diagram of a semiconductor memory device according to some example embodiments.

FIG. 14 is a schematic layout diagram of a semiconductor memory device according to some example embodiments. For convenience of description, the description is based on differences thereof from those described with reference to FIG. 1 to FIG. 9.

For reference, FIG. 14 is a schematic layout diagram of a R2 area in FIG. 1.

Referring to FIG. 14, in the semiconductor device according to some example embodiments, the dummy bit-line group BL_DG includes six dummy bit-lines.

The dummy bit-line group BL_DG includes 5 inner dummy bit-lines BL_DB and one outermost dummy bit-line BL_DA.

A width W21 of the outermost dummy bit-line BL_DA and each of widths W22 and W23 of the inner dummy bit-lines BL_DB in the first direction D1 are illustrated as being equal to each other. However, the present inventive concepts are not limited thereto.

The inner dummy bit-line BL_DB may include a first inner dummy bit-line BL_DB and a second inner dummy bit-line BL_DB. The first inner dummy bit-line BL_DB may be disposed between the second inner dummy bit-line BL_DB and the outermost dummy bit-line BL_DA. The first inner dummy bit-line BL_DB may be or may not be a dummy bit-line closest to the outermost dummy bit-line BL_DA.

A width of the first inner dummy bit-line BL_DB in the first direction D1 may be W22. A width of the second inner dummy bit-line BL_DB in the first direction D1 may be W23.

In one example, the width W21 of the outermost dummy bit-line BL_DA may be greater than each of the widths W22 and W23 of the inner dummy bit-lines BL_DB in the first direction D1. The width W22 of the first inner dummy bit-line BL_DB may be equal or substantially equal to the width W23 of the second inner dummy bit-line BL_DB. Each of the widths W22 and W23 of the inner dummy bit-lines BL_DB may be equal to the width W1 of the normal bit-line BL_N.

In another example, the width W22 of the first inner dummy bit-line BL_DB may be greater than the width W23 of the second inner dummy bit-line BL_DB. The width W21 of the outermost dummy bit-line BL_DA may be smaller than or equal to the width W22 of the first inner dummy bit-line BL_DB. The width W23 of the second inner dummy bit-line BL_DB may be equal or substantially equal to the width W1 of the normal bit-line BL_N.

FIG. 15 to FIG. 21 are diagrams of intermediate structures of steps for illustrating a method for manufacturing a semiconductor memory device according to some example embodiments. Those of descriptions of the manufacturing method that are duplicate with those described using FIG. 1 to FIG. 14 are briefly described or omitted. Further, the description of the manufacturing method is made using a cross section cut along the lines A-A and B-B of FIG. 4.

Referring to FIG. 1 to FIG. 5, FIG. 15 to FIG. 17, the substrate 100 including the cell area 20, the peripheral area 24, and the cell area separation film 22 is provided.

In the cell area 20, the cell element isolation film 105 separation the cell active area ACT may be formed.

The cell gate structure 110 may be formed in the substrate 100 and in the cell area 20. The cell gate structure 110 may extend in an elongate manner in the first direction D1. The cell gate structure 110 may include the cell gate trench 115, the cell gate insulating film 111, the cell gate electrode 112, the cell gate capping pattern 113, and the cell gate capping conductive film 114.

Subsequently, the cell insulating film 130 may be formed on the cell area 20. The cell insulating film 130 may expose a portion of the substrate 100 in the peripheral area 24.

Subsequently, the cell conductive lines 140N, 140DA, 140DB, and the cell line capping film 144 may be formed on the substrate 100 and in the cell area 20. That is, a plurality of bit-lines BL extending in the second direction D2 may be formed on the substrate 100 and in the cell area 20. The outermost dummy cell conductive line 140DA and the inner dummy cell conductive line 140DB are disposed in the dummy cell area 20_DCR, while the normal cell conductive line 140N is disposed in the normal cell area 20_NCR.

While the cell conductive lines 140N, 140DA, and 140DB and the cell line capping film 144 are being formed, the peripheral gate conductive film 240 and the peripheral capping film 244 may be formed. The insulating material film including the peripheral capping film 244, the lower etch stop film 250, and the upper peripheral interlayer insulating film 291 may be patterned such that the cell line capping film 144 may be formed.

The peripheral structure PR_ST is formed in the peripheral area 24. The peripheral structure PR_ST may include the peripheral gate conductive film 240, the peripheral capping film 244, the peripheral gate insulating film 230, the peripheral spacer 245, the lower peripheral interlayer insulating film 290, and the upper peripheral interlayer insulating film 291.

While the cell conductive lines 140N, 140DA, and 140DB and the cell line capping film 144 are being formed, the bit-line contact 146 may be formed.

Figure 15:
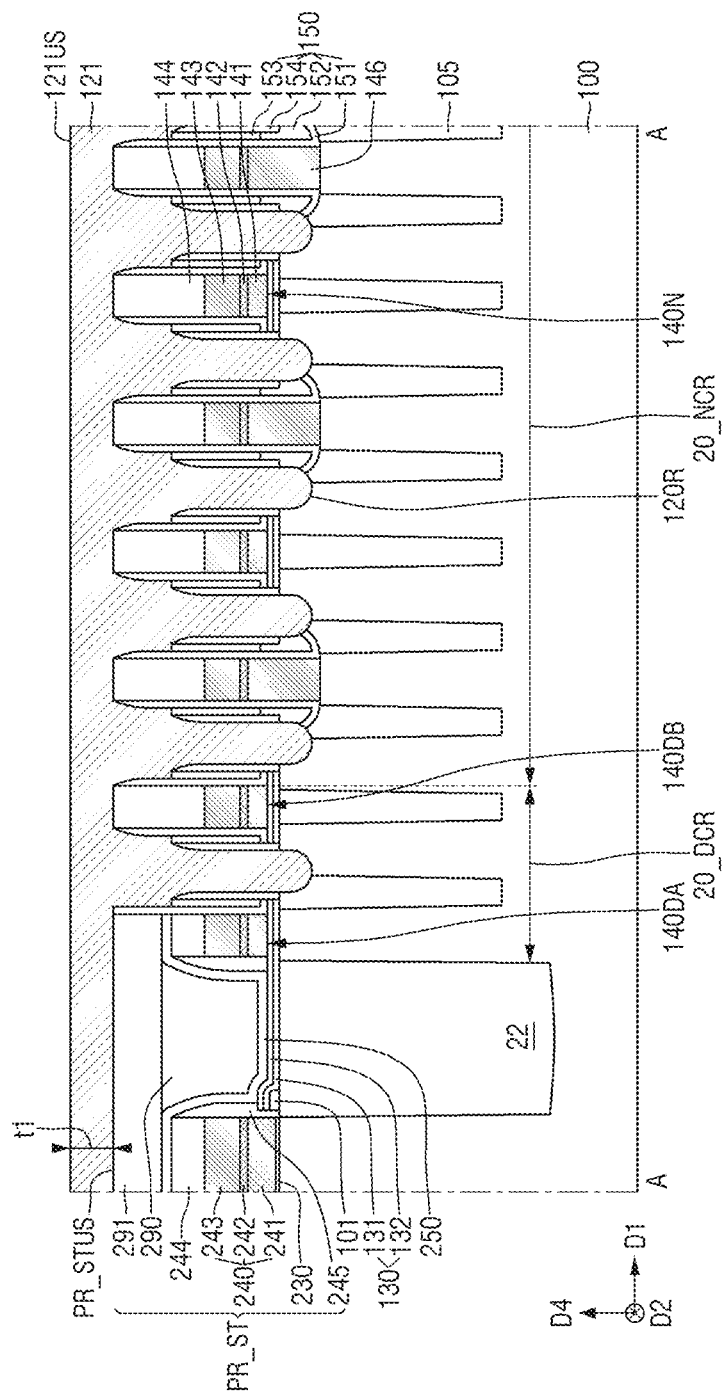
FIG. 15, 16, 17, 18, 19, 20 and FIG. 21 are diagrams of intermediate structures of steps for illustrating a method for manufacturing a semiconductor memory device according to some example embodiments.

In FIG. 15, a ratio of the width of the first outermost dummy cell conductive line 140DA in the first direction D1 to the width of the inner dummy cell conductive line 140DB in the first direction D1 may be in a range from 1 inclusive to 2 inclusive.

Figure 16:
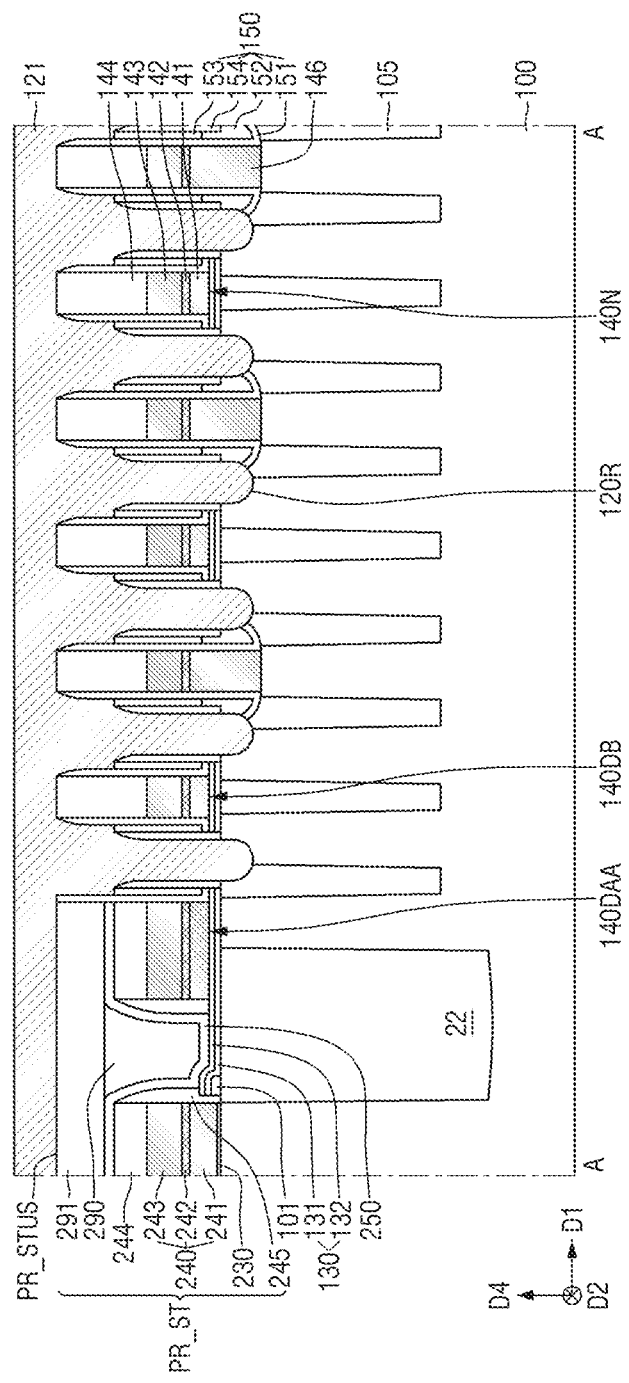

In FIG. 16, a ratio of the width of the second outermost dummy cell conductive line 140DAA in the first direction D1 to the width of the inner dummy cell conductive line 140DB in the first direction D1 may be greater than or equal to 3. The second outermost dummy cell conductive line 140DAA may correspond to the outermost dummy bit-line BL_DA.

Following description is made with reference to FIG. 15.

Subsequently, the cell line spacer 150 may be formed. While the fourth cell line spacer 154 is formed, a storage contact recess 120R may be formed between the cell conductive lines 140N, 140DA, and 140DB adjacent to each other in the first direction D1.

A vertical level of the top face PR_STUS of the peripheral structure based on a top face of the substrate 100 is shown to be the same or substantially the same as a vertical level of the top face of the cell line capping film 144 based on the top face of the substrate 100. However, this is only for convenience of illustration. The present inventive concepts are not limited thereto.

Subsequently, the first semiconductor material film 121 may be formed on the substrate 100. The first semiconductor material film 121 may include a semiconductor material containing impurities therein. For example, the first semiconductor material film 121 may include, but is not limited to, amorphous silicon including the impurities therein.

The first semiconductor material film 121 may cover the cell conductive lines 140N, 140DA, 140DB and the peripheral structure PR_ST. The first semiconductor material film 121 may cover the top face of the cell line capping film 144 and the top face PR_STUS of the peripheral structure. The first semiconductor material film 121 may cover the top face of the cell gate capping pattern 113.

The first semiconductor material film 121 may fill or substantially fill the storage contact recess 120R. The first semiconductor material film 121 may fill or substantially fill a space between the cell conductive lines 140N, 140DA, and 140DB adjacent to each other in the first direction D1.

A thickness t1 of the first semiconductor material film 121 may satisfy a following Relationship 1. The thickness t1 of the first semiconductor material film 121 may be a distance from the top face PR_STUS of the peripheral structure to the top face 121US of the first semiconductor material film.

$$\left(\frac{N}{2} + \frac{1}{8} + \Delta\right)\frac{\lambda}{n_{a-Si}} \leq t_{a-Si} \leq \left(\frac{N}{2} + \frac{3}{8} + \Delta\right)\frac{\lambda}{n_{a-Si}} \quad \text{(Relationship 1)}$$

In the Relationship 1, $t_{a-Si}$ may denote the thickness t1 of the first semiconductor material film 121. $\lambda$ denotes a wavelength of laser used in a laser annealing process (e.g., 60 in FIG. 18). $n_{a-Si}$ denotes a refractive index of the first semiconductor material film 121. N is one of 1, 2, and 3. $\Delta$ denotes an optical path correction factor. $\Delta$ may be in a range from −⅛ inclusive to ⅛ inclusive.

Alternatively, N may be a natural number of 4 or greater. When N is a natural number greater than 4, the thickness t1 of the first semiconductor material film 121 may be larger than desired or necessary. In this case, efficiency of the manufacturing process may be deteriorated, and a process unit cost may increase.

For example, when the first semiconductor material film 121 includes amorphous silicon, $n_{a-Si}$ may refer to a refractive index of the amorphous silicon. The optical path correction factor may be affected by a difference between the vertical level of the top face PR_STUS of the peripheral structure disposed on the substrate 100 and the vertical level of the top face of the cell line capping film 144. Further, the optical path correction factor may be affected by a shape of the peripheral structure PR_ST disposed in the peripheral area 24, and the width of and a spacing between the cell conductive lines 140N, 140DA, and 140DB disposed in the cell area 20.

Figure 18:
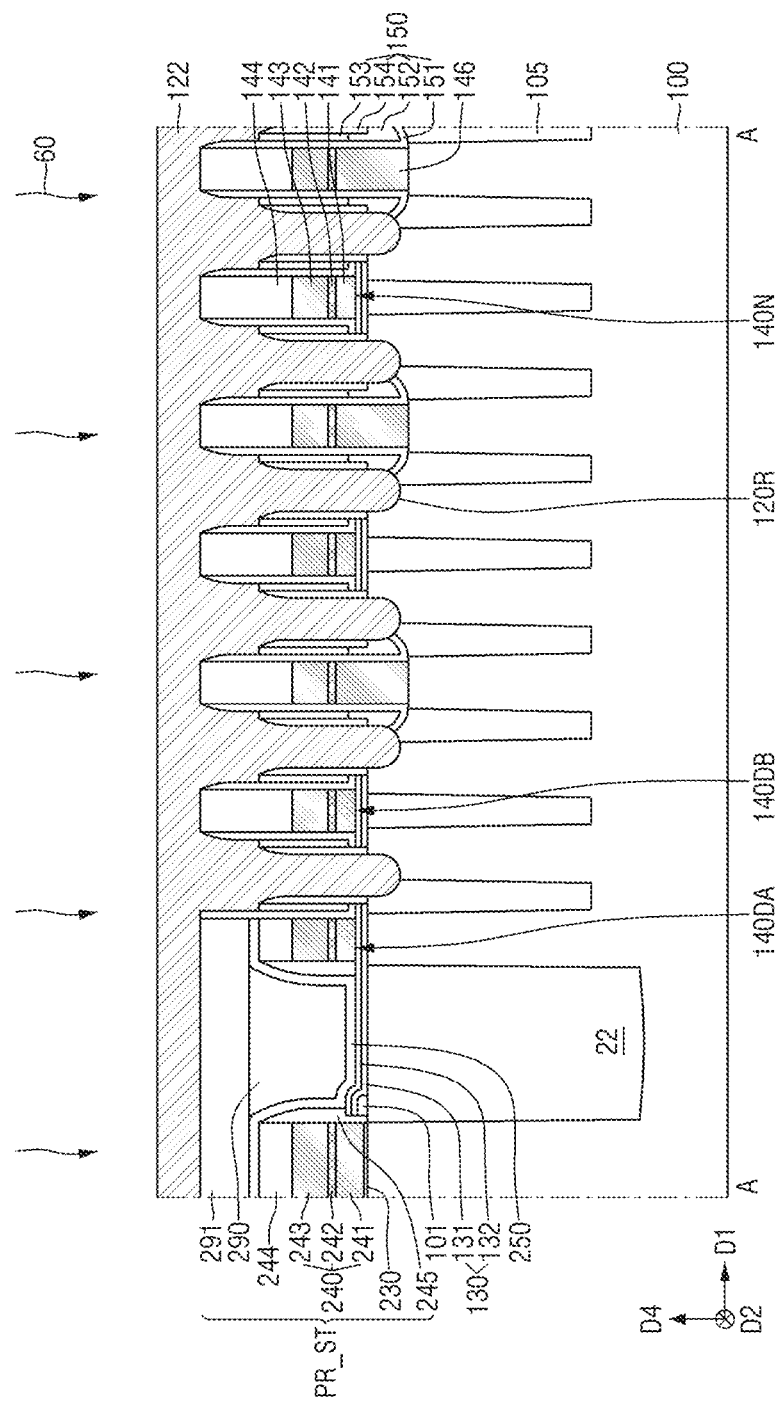
Figure 19:
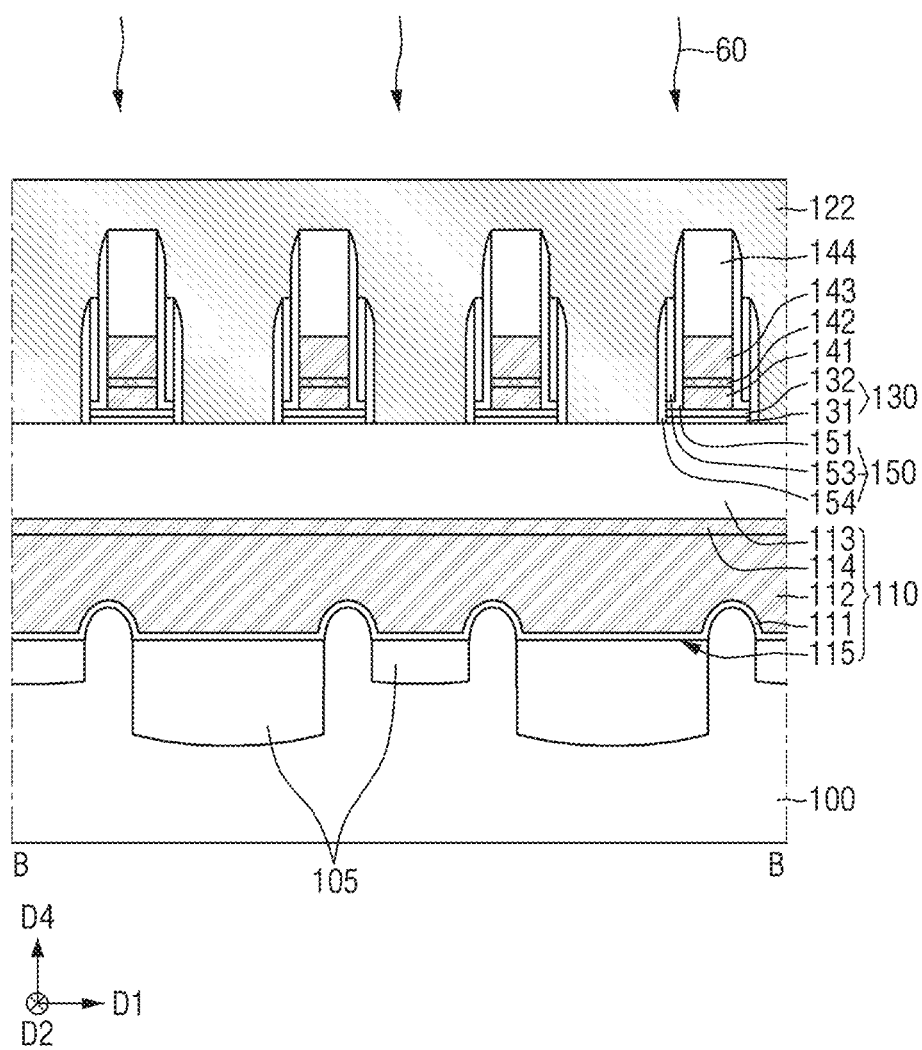

Referring to FIG. 18 and FIG. 19, the laser may be irradiated onto the first semiconductor material film 121. The laser annealing process 60 may be performed.

Under the laser annealing process 60, a second semiconductor material film 122 may be formed on the substrate 100. The second semiconductor material film 122 may be formed by recrystallizing the first semiconductor material film 121. When the laser is irradiated onto the first semiconductor material film 121, the first semiconductor material film 121 is heated and melts, so that the first semiconductor material film 121 may be recrystallized.

Although not shown, the first air gap (e.g., AG_BC of FIG. 10) may be formed in the second semiconductor material film 122. Alternatively, the second air gap (AG_DC of FIG. 11) may be formed between each of the cell conductive lines 140N, 140DA, and 140DB and the bit-line contact 146.

Figure 20:
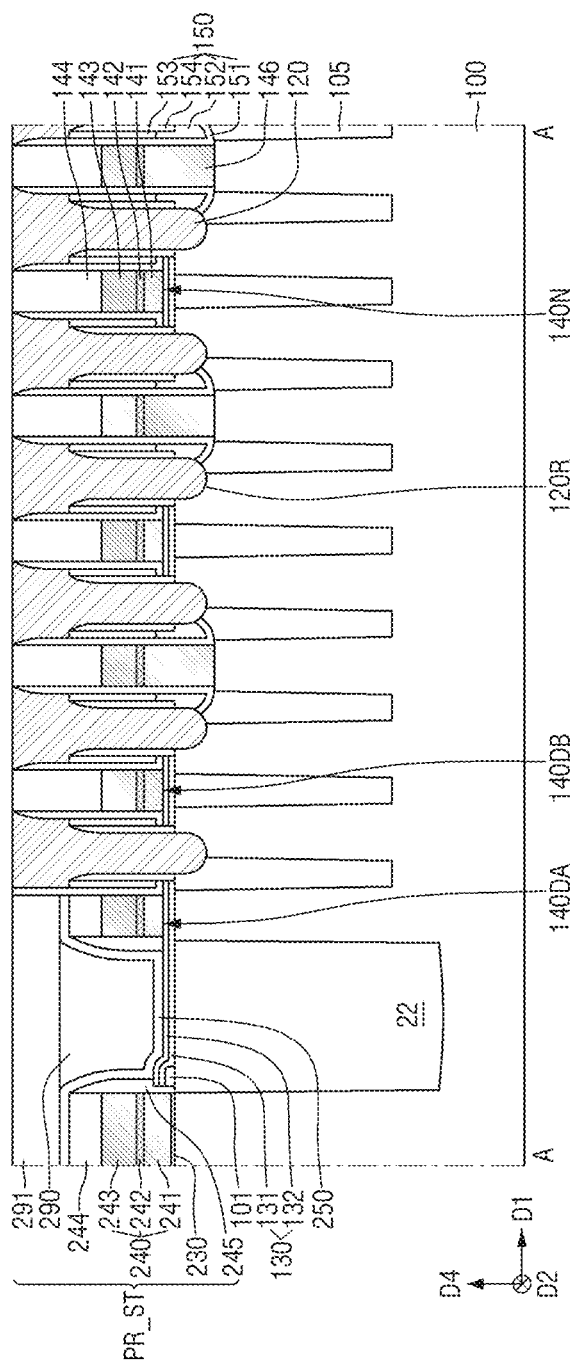
Figure 21:
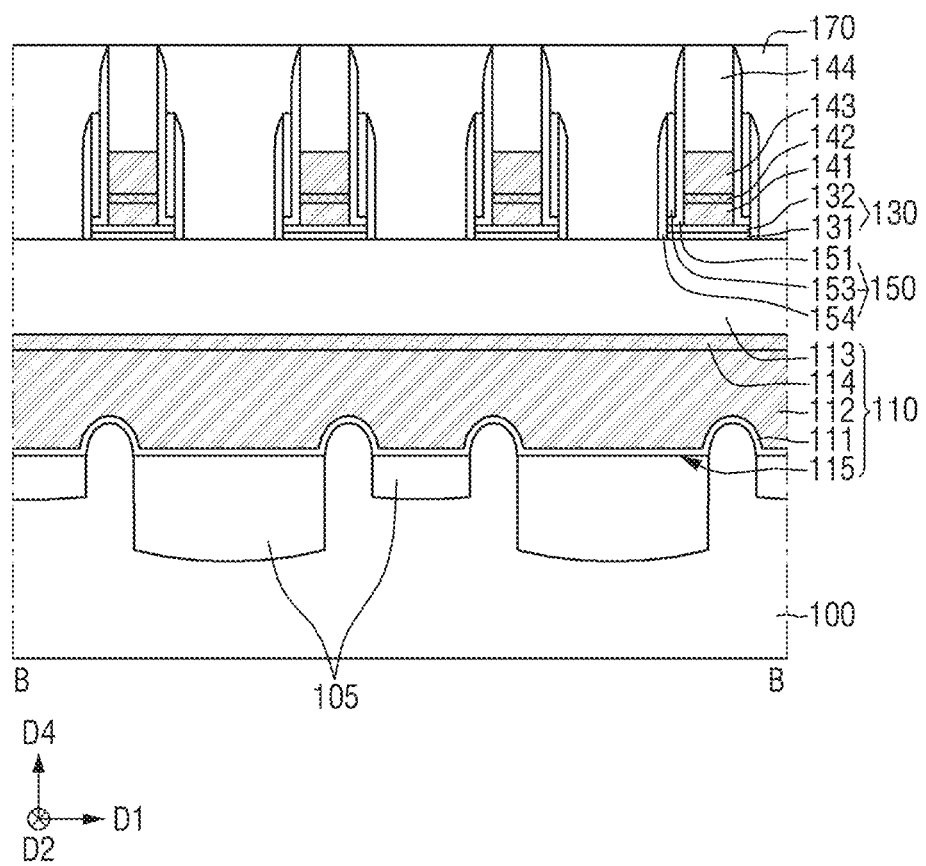

Referring to FIG. 20 and FIG. 21, a portion of the second semiconductor material film 122 on a top face of the cell line capping film 144 and the top face PR_STUS of the peripheral structure may be removed.

The second semiconductor material film 122 may be patterned such that the storage contact 120 may be formed on the substrate 100 and in the cell area 20. The storage contact 120 may be connected to the active area ACT of the cell area 20.

The fence pattern 170 may be formed on the cell gate structure 110. The fence pattern 170 may fill or substantially fill a space in which a portion of the second semiconductor material film 122 has been removed.

Although not shown, a portion of the storage contact 120 may be removed after the second semiconductor material film 122 has been patterned. A vertical level of a top face of the storage contact 120 may be lower than that of a top face of the cell line capping film 144.

Then, referring to FIG. 6 and FIG. 7, the storage pad 160 may be formed on the storage contact 120. Further, the information storage element 190 connected to the storage pad 160 may be formed.

Figure 22:
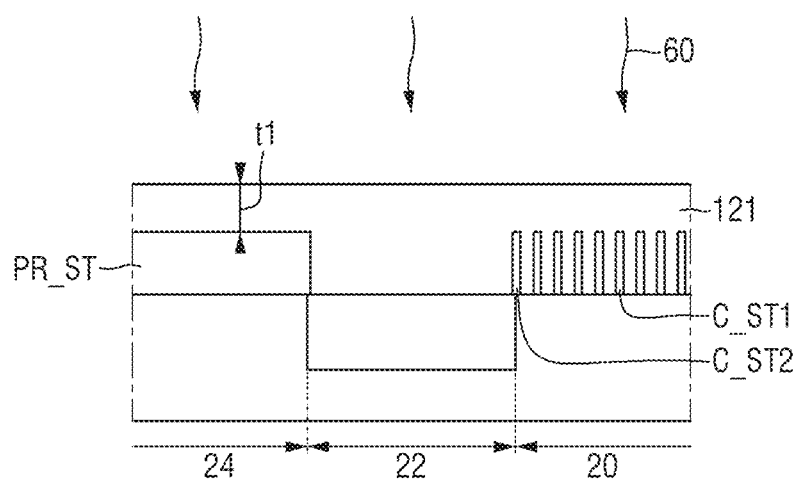
FIG. 22 and FIG. 23 are diagrams to illustrate an effect of a thickness of the semiconductor material film formed on the substrate on intensity of laser energy absorbed by the semiconductor material film.
Figure 23:
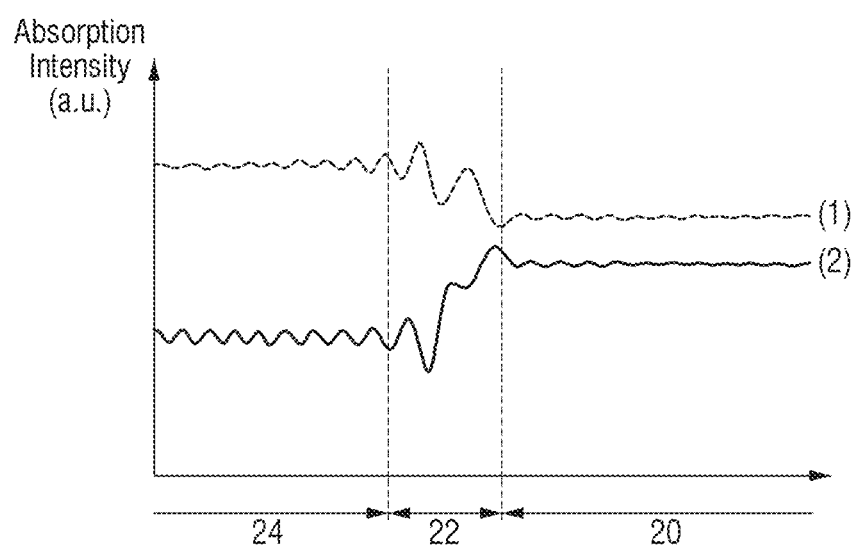

FIG. 22 and FIG. 23 are diagrams to illustrate an effect of a thickness of the semiconductor material film formed on the substrate on intensity of laser energy absorbed by the semiconductor material film.

The first cell structure C_ST1, the second cell structure C_ST2 and the peripheral structure PR_ST may be disposed on the substrate 100 including the cell area 20, the cell area separation film 22, and the peripheral area 24. The second cell structure C_ST2 may refer to a structure disposed at the outermost portion of the cell area 20 among the first and second cell structures C_ST1 and C_ST2.

The first semiconductor material film 121 may cover the first cell structure C_ST1, the second cell structure C_ST2, and the peripheral structure PR_ST.

When the thickness t1 of the first semiconductor material film 121 does not satisfy the Relationship 1, the intensity of laser energy absorbed by the first semiconductor material film 121 may correspond to (1) in FIG. 23.

When the laser annealing process 60 is performed while the thickness t1 of the first semiconductor material film 121 does not satisfy the Relationship 1, excessive heat may be generated near the cell area separation film 22. The heat generated from the laser annealing process 60 may flow to the cell area 20 which contacts the cell area separation film 22 such that a boundary is defined therebetween. That is, inside the first semiconductor material film 121, the heat flow from the peripheral area 24 to the cell area 20 may occur. Thus, the heat flow may affect the bit-line contact 146 made of a semiconductor material near the boundary of the cell area 20. That is, a defect may occur between the normal cell conductive line 140N and the bit-line contact 146 disposed near the boundary of the cell area 20.

When the thickness t1 of the first semiconductor material film 121 satisfies the above Relationship 1, the intensity of laser energy absorbed by the first semiconductor material film 121 may correspond to (2) of FIG. 23.

When the laser annealing process 60 is performed while the thickness t1 of the first semiconductor material film 121 does not satisfy the Relationship 1, excessive heat may not be generated near the cell area separation film 22.

FIG. 24 to FIG. 27 are diagrams to illustrate an effect of an arrangement of structures on the substrate on intensity of laser energy absorbed by the semiconductor material film.

In FIG. 24 to FIG. 27, the first cell structure C_ST1, the second cell structure C_ST2, and the peripheral structure PR_ST may be disposed on the substrate 100.

The first cell structure C_ST1 may have a fourth width W31. The second cell structure C_ST2 may have a fifth width W32. The cell structures C_ST1 and C_ST2 may include one second cell structure C_ST2 and at least one first cell structure C_ST1.

The first cell structure C_ST1 may correspond to the inner dummy cell conductive line 140DB and the normal cell conductive line 140N as described with reference to FIG. 1 to FIG. 14. The second cell structure C_ST2 may correspond to the first outermost dummy cell conductive line 140DA.

Figure 24:
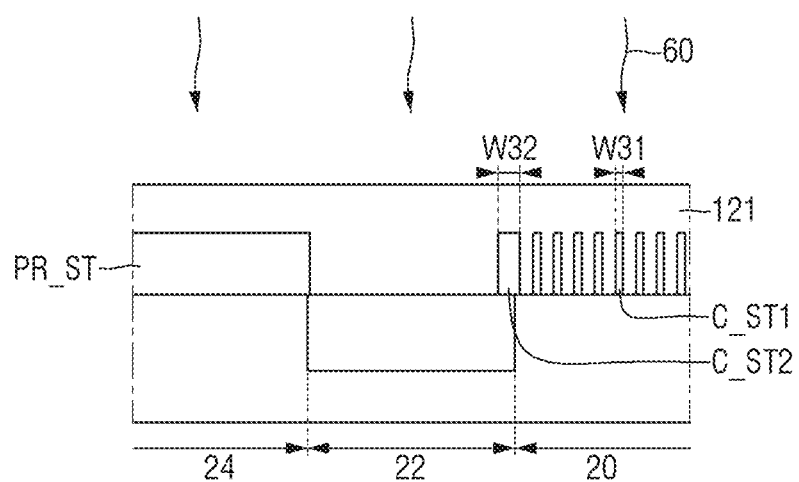
FIG. 24, 25, 26 and FIG. 27 are diagrams to illustrate an effect of an arrangement of structures on the substrate on intensity of laser energy absorbed by the semiconductor material film.
Figure 25:
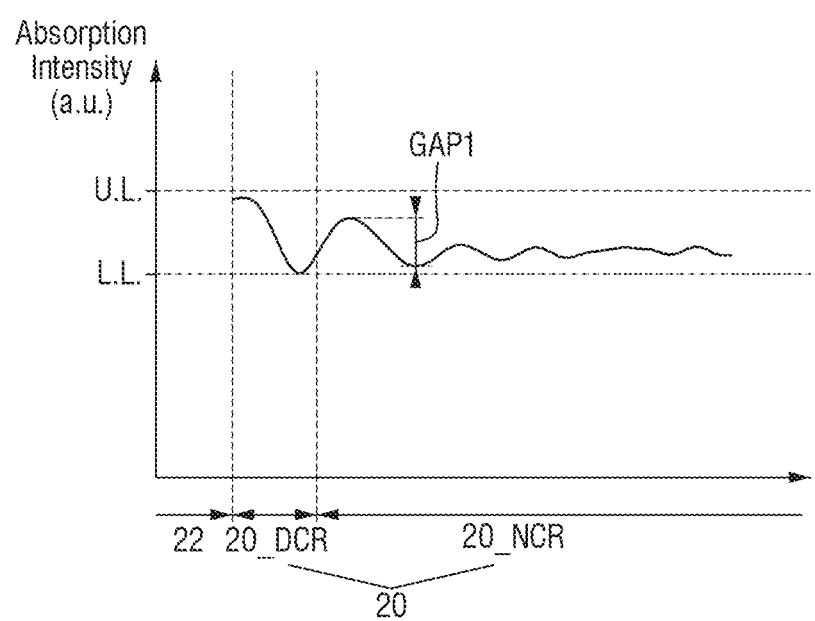
Figure 26:
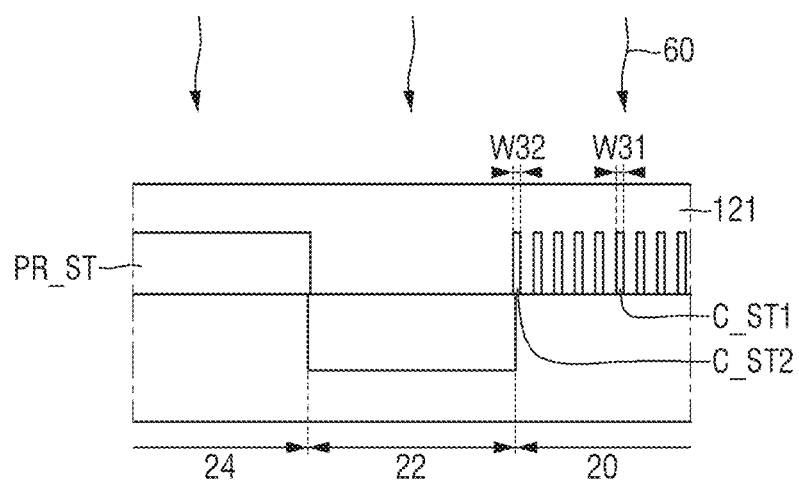
Figure 27:
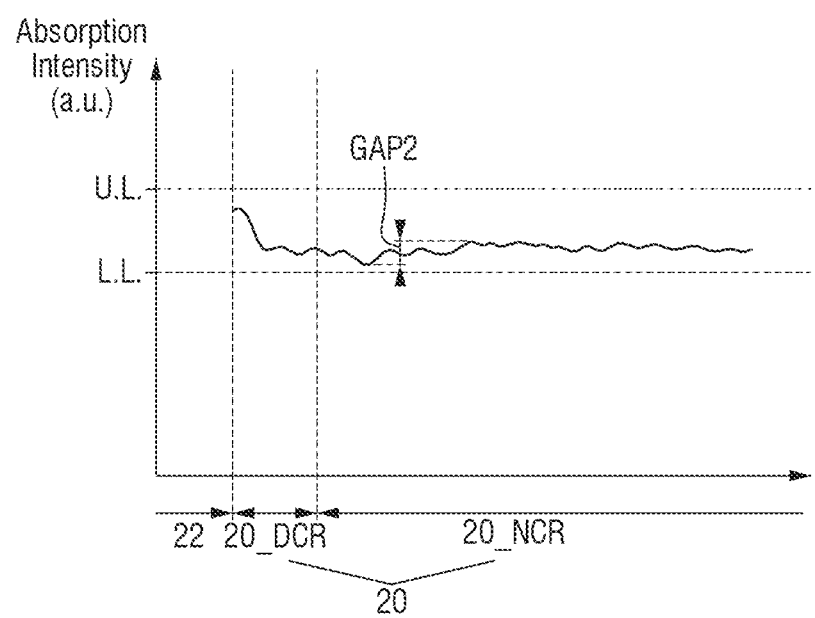

FIG. 25 and FIG. 27 are graphs showing the intensity of laser energy absorbed by the first semiconductor material film 121 on the cell area 20 under the laser annealing process 60. FIG. 25 is a graph showing the intensity of laser energy absorbed by the first semiconductor material film 121 when the cell structures C_ST1 and C_ST2 are arranged as shown in FIG. 24. FIG. 27 is a graph showing the intensity of laser energy absorbed by the first semiconductor material film 121 when the cell structures C_ST1 and C_ST2 are arranged as shown in FIG. 26.

In FIG. 25 and FIG. 27, the cell area 20 may include the dummy cell area 20_DCR and the normal cell area 20_NCR. The intensity of laser energy absorbed by the first semiconductor material film 121 on the cell area 20 may be located between an upper limit U.L. of absorption intensity and a lower limit L.L. of absorption intensity.

A ratio W32/W31 of the width W32 of the second cell structure C_ST2 to the width W31 of the first cell structure C_ST1 in FIG. 24 is greater than a ratio W32/W31 of the width W32 of the second cell structure C_ST2 to the width W31 of the first cell structure C_ST1 in FIG. 26. In FIG. 26, the ratio W32/W31 of the width W32 of the second cell structure C_ST2 to the width W31 of the first cell structure C_ST1 may be greater than or equal to 1.

In the normal cell area 20_NCR of FIG. 25, a difference between a maximum value and a minimum value of the intensity of laser energy absorbed by the first semiconductor material film 121 may be a first energy gap GAP1. In the normal cell area 20_NCR of FIG. 27, the difference between the maximum value and the minimum value of the intensity of laser energy absorbed by the first semiconductor material film 121 may be a second energy gap GAP2.

The second energy gap GAP2 in the normal cell area 20_NCR of FIG. 27 is smaller than the first energy gap GAP1 in the normal cell area 20_NCR of FIG. 25. In other words, as the ratio W32/W31 of the width W32 of the second cell structure C_ST2 to the width W31 of the first cell structure C_ST1 decreases, the energy gap in the normal cell area 20_NCR may decrease.

When a process condition of the laser annealing process 60 varies, a probability at which the intensity of laser energy absorbed by the first semiconductor material film 121 deviates out of the upper limit U.L. of absorption intensity or the lower limit L.L. of absorption intensity in FIG. 25 is higher than that in FIG. 27. That is, reducing the ratio W32/W31 of the width W32 of the second cell structure C_ST2 to the width W31 of the first cell structure C_ST1 may allow stability and reliability of the manufacturing process to be improved.

The ratio W32/W31 of the width W32 of the second cell structure C_ST2 to the width W31 of the first cell structure C_ST1 may be in a range from 1 inclusive to 2 inclusive. Preferably, the ratio W32/W31 of the width W32 of the second cell structure C_ST2 to the width W31 of the first cell structure C_ST1 may be in a range from 1 inclusive to 1.7 inclusive. More preferably, the ratio W32/W31 of the width W32 of the second cell structure C_ST2 to the width W31 of the first cell structure C_ST1 may be in a range from 1 inclusive to 1.5 inclusive.

FIG. 28 to FIG. 32 are diagrams of intermediate structures of steps for illustrating a method for manufacturing a semiconductor memory device according to some example embodiments. FIG. 33 is a diagram showing reflectance of laser based on a thickness of an anti-reflective film.

Figure 17:
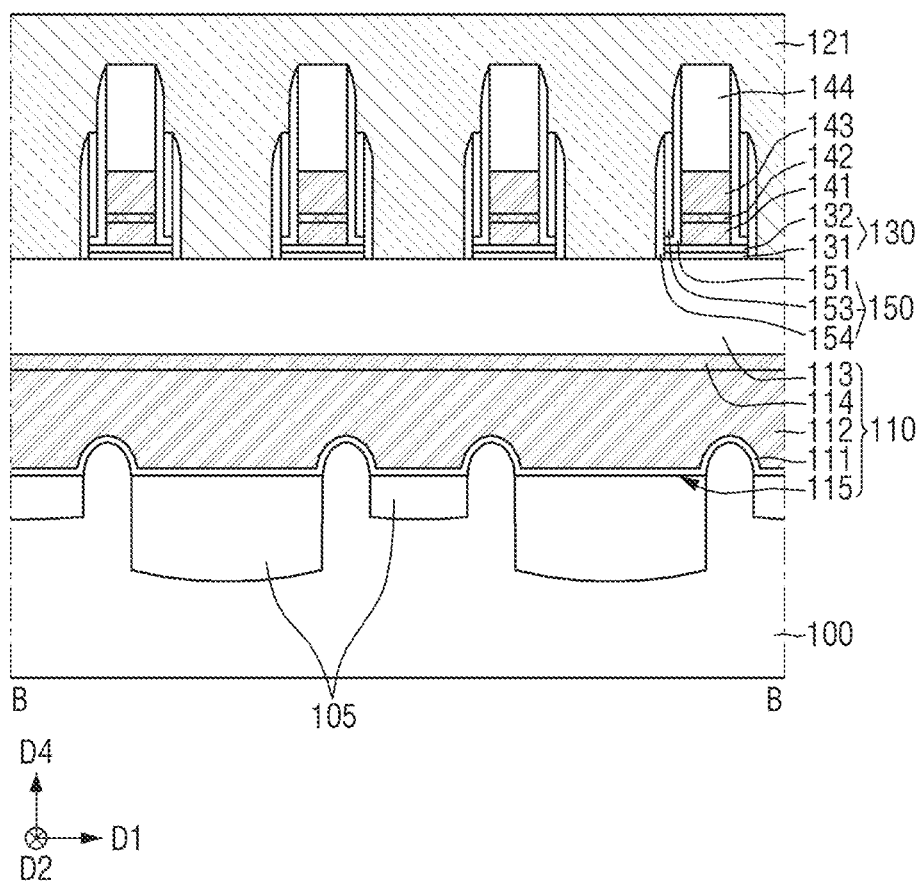
Figure 28:
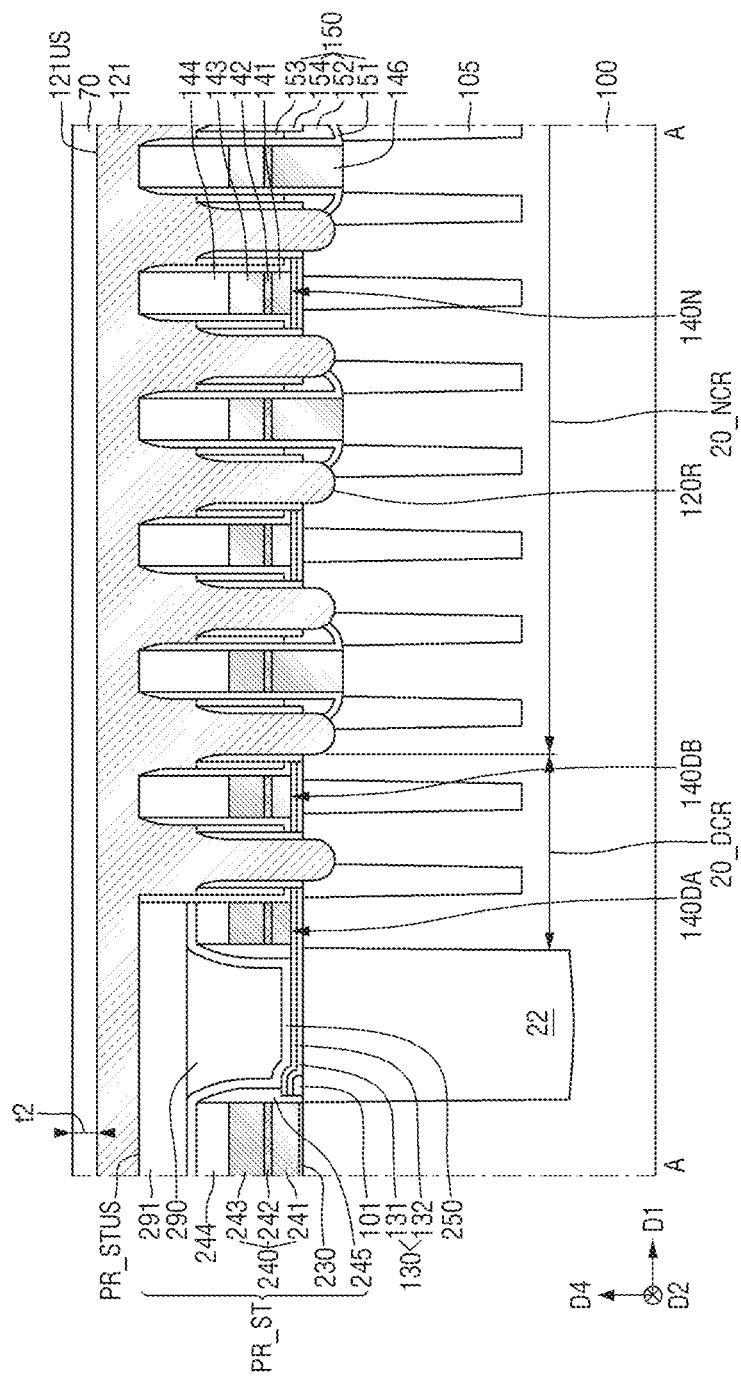
FIG. 28, 29, 30, 31, and FIG. 32 are diagrams of intermediate structures of steps for illustrating a method for manufacturing a semiconductor memory device according to some example embodiments.
Figure 29:
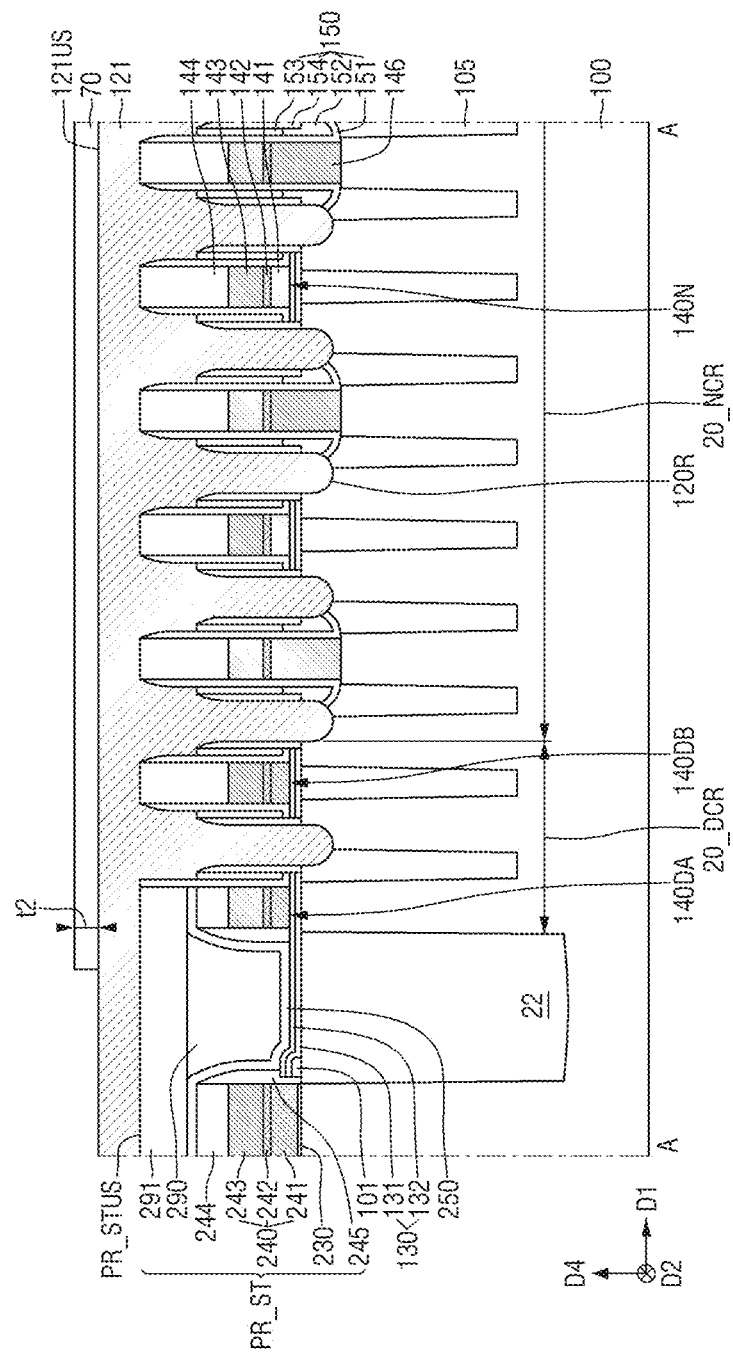
Figure 30:
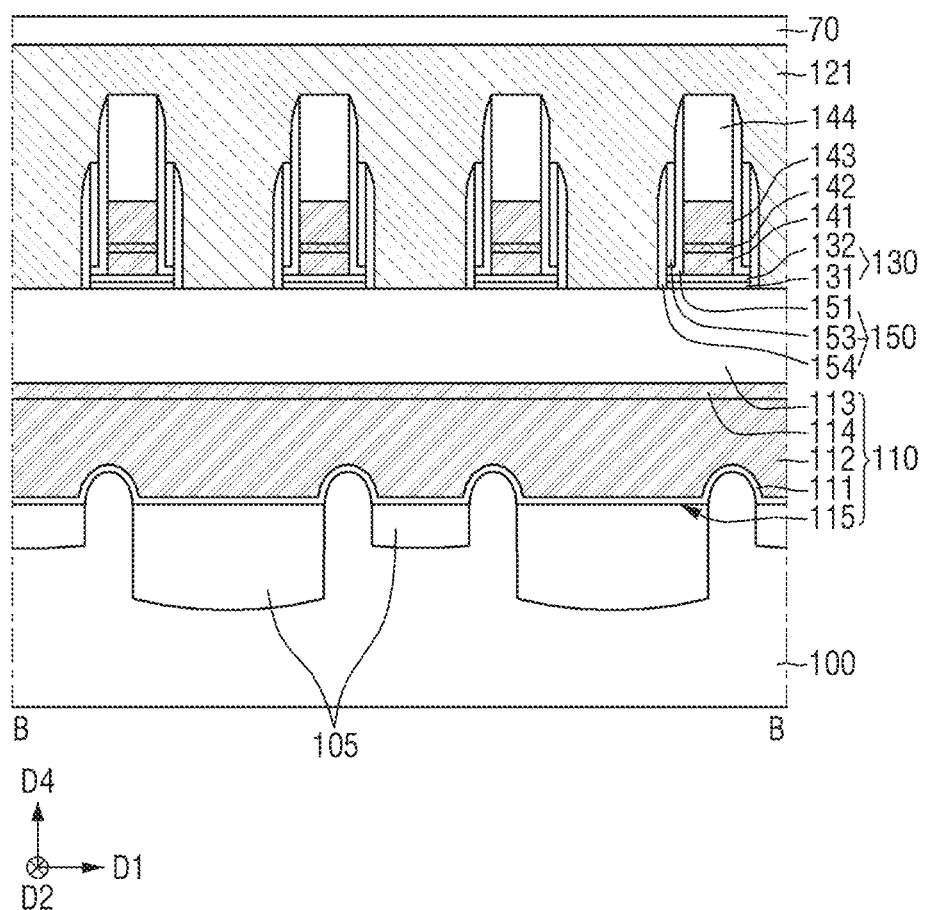

For reference, FIG. 28 to FIG. 30 may be directed to a manufacturing process performed after FIG. 15 to FIG. 17.

Referring to FIG. 1 to FIG. 9 and FIG. 28 to FIG. 30, an anti-reflective film 70 may be formed on the first semiconductor material film 121.

The anti-reflective film 70 may be made of an insulating material. The anti-reflective film 70 may be formed of, for example, a single film. A refractive index of the anti-reflective film 70 is lower than that of the first semiconductor material film 121. The anti-reflective film 70 may include, for example, silicon oxide. The inventive concepts are not limited thereto.

A thickness t2 of the anti-reflective film 70 may satisfy a following Relationship 2.

$$0 \leq t_{ox} \leq \frac{\lambda}{2n_{ox}} \quad \text{(Relationship 2)}$$

In the above Relationship 2, $t_{ox}$ may denote the thickness t2 of the anti-reflective film 70. $\lambda$ denotes the wavelength of the laser used in the laser annealing process (e.g., 60 in FIG. 31). $n_{ox}$ denotes the refractive index of the anti-reflective film 70. When the anti-reflective film 70 includes silicon oxide, $n_{ox}$ may denote a refractive index of silicon oxide.

In FIG. 33, as the thickness of the anti-reflective film increases, the reflectance of the laser decreases and then increases. In other words, as the thickness of the anti-reflective film increases, the intensity of laser energy absorbed by the first semiconductor material film 121 increases and then decreases.

When a specific reflectance Rc desired or required for the manufacturing process is set, the thickness t2 of the anti-reflection layer 70 may be set to $t_{2a}$ and $t_{2b}$. The specific reflectance Rc may vary depending on an amount of energy required for recrystallization of the first semiconductor material film 121.

In FIG. 28, the anti-reflective film 70 may be formed on the cell area 20, the cell area separation film 22, and the peripheral area 24. That is, the anti-reflective film 70 may be formed over an entirety or substantially all of a top face of the substrate 100.

In FIG. 29, the anti-reflective film 70 may be formed on the cell area 20. The anti-reflective film 70 may overlap the cell area 20 in a fourth direction D4. The anti-reflective film 70 may overlap at least a portion of the cell area separation film 22 in the fourth direction D4. The anti-reflective film 70 may not overlap the peripheral area 24 in the fourth direction D4. Contrary to what is shown, in one example, the anti-reflective film 70 may not overlap the cell area separation film 22 in the fourth direction D4. In another example, the anti-reflective film 70 may not overlap a portion of the cell area 20 in the fourth direction D4. In still another example, at least a portion of the peripheral area 24 does not overlap the anti-reflective film 70 in the fourth direction D4. A portion of the peripheral area 24 may not overlap the anti-reflective film 70 in the fourth direction D4, and the remainder of the peripheral area 24 may overlap the anti-reflective film 70 in the fourth direction D4.

Following description is made with reference to FIG. 28.

Figure 31:
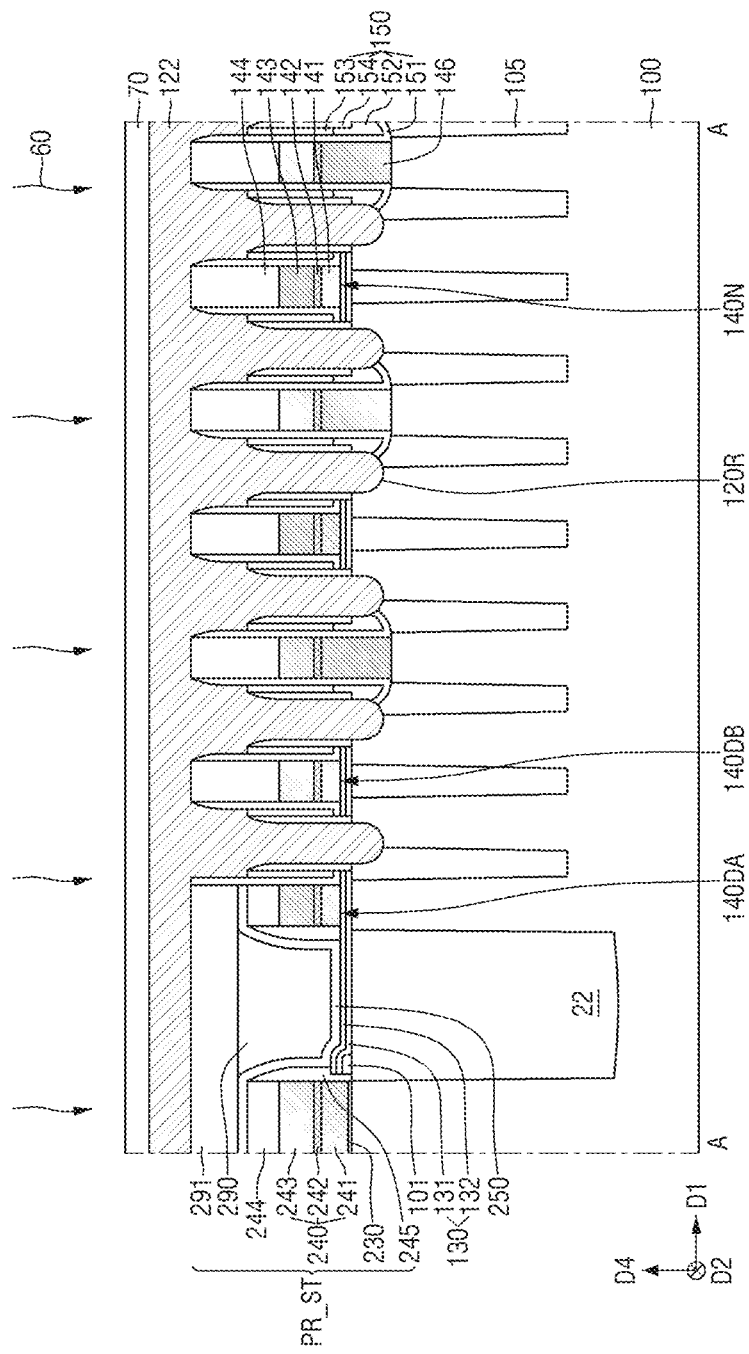
Figure 32:
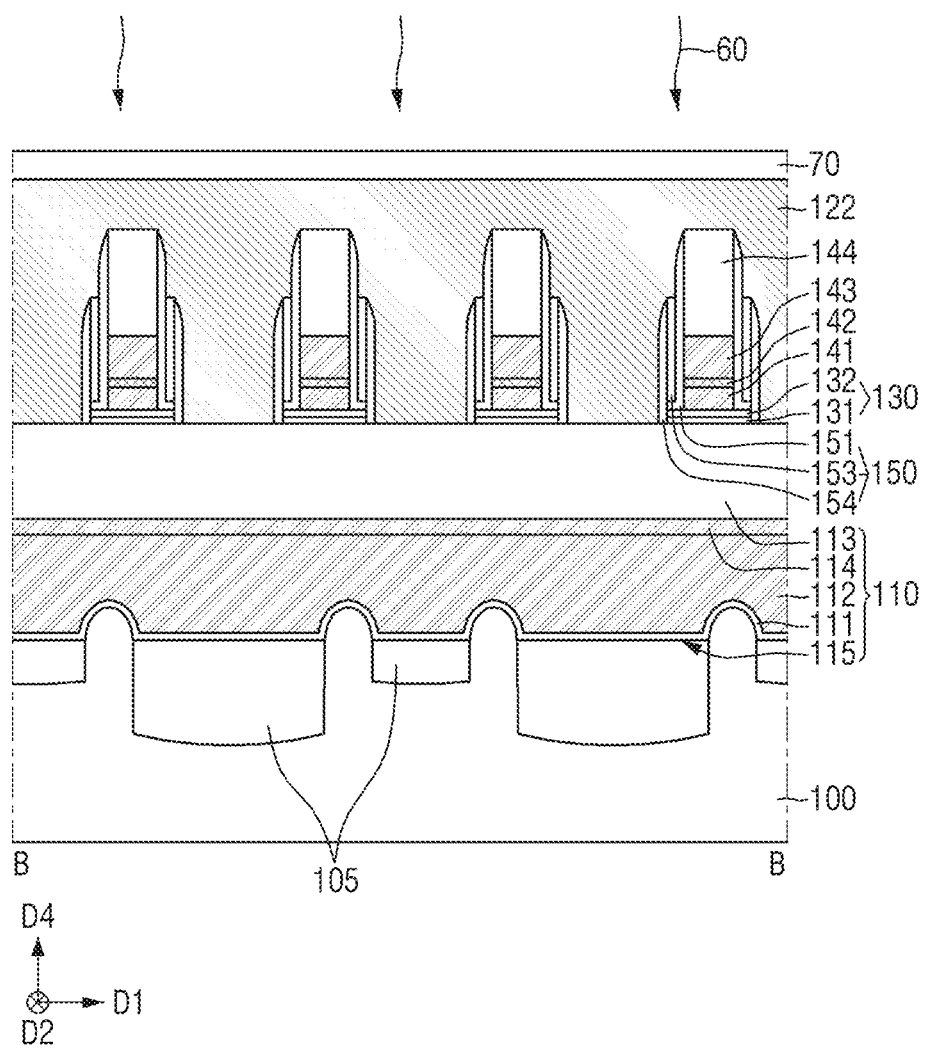
Figure 33:
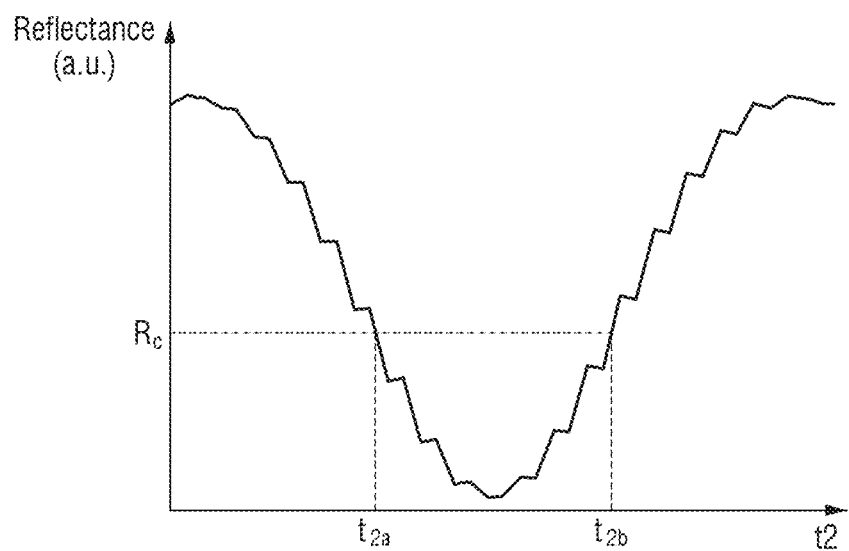
FIG. 33 is a diagram showing reflectance of laser based on a thickness of an anti-reflective film.

Referring to FIG. 31 and FIG. 32, the laser may be irradiated onto the first semiconductor material film 121 on which the anti-reflective film 70 has been formed. The laser annealing process 60 using the anti-reflective film 70 may be performed.

Under the laser annealing process 60, the first semiconductor material film 121 may be recrystallized, such that the second semiconductor material film 122 may be formed on the substrate 100.

Although not shown, the first air gap (e.g., AG_BC of FIG. 10) may be formed in the second semiconductor material film 122. Alternatively, the second air gap (e.g., AG_DC of FIG. 11) may be formed between each of the cell conductive lines 140N, 140DA, and 140DB and the bit-line contact 146.

Then, the anti-reflective film 70 on the second semiconductor material film 122 may be removed. Subsequently, the second semiconductor material film 122 may be patterned such that the storage contact 120 may be formed on the substrate 100 and in the cell area 20.

One or more of the elements disclosed above may include or be implemented in one or more processing circuitries such as hardware including logic circuits; a hardware/software combination such sa a processor executing software; or a combination thereof. For example, the processing circuitries more specifically may include, but is not limited to, a central processing unit (CPU), an arithmetic logic unit (ALU), a digital signal processor, a microcomputer, a field programmable gate array (FGPA), a System-on-Chip (SoC), a programmable logic unit, a microprocessor, application-specific integrated circuit (ASIC), etc.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

Although example embodiments of the present inventive concepts have been described in more detail with reference to the accompanying drawings, the present inventive concepts are not necessarily limited to these example embodiments. The present inventive concepts may be implemented in various modified manners within the scope not departing from the present inventive concepts. Accordingly, the example embodiments disclosed herein are not intended to limit the present inventive concepts. Therefore, it should be understood that the example embodiments as described above are illustrative and non-limiting in all respects.

What is claimed is:

1. A semiconductor memory device comprising:
a substrate including a cell area and a peripheral area defined by a periphery of the cell area, wherein the cell area includes a dummy cell area and a normal cell area, wherein the cell area includes an active area defined by a cell element isolation film;
a cell area separation film defining the cell area in the substrate, wherein the dummy cell area defines a boundary with the cell area separation film between the normal cell area and the cell area separation film;
a normal bit-line on the normal cell area and extending in a first direction;
a dummy bit-line group on the dummy cell area, wherein the dummy bit-line group includes a plurality of dummy bit-lines extending in the first direction; and
a plurality of storage contacts connected to the active area and located along a second direction perpendicular to the first direction,
wherein a width in the second direction of the dummy cell area is greater than or equal to 50 nm and less than or equal to 200 nm,
wherein the normal bit-line has a first width in the second direction, and
wherein a ratio of a width in the second direction of each of the dummy bit-lines to the first width is greater than or equal to 1 and less than or equal to 2.

2. The semiconductor memory device of claim 1, wherein the dummy bit-line group includes a first dummy bit-line closest to the peripheral area in the second direction, and a second dummy bit-line between the first dummy bit-line and the normal bit-line,
wherein the first dummy bit-line has a second width in the second direction,
wherein the second dummy bit-line has a third width in the second direction, and
wherein the second width is greater than or equal to the third width.

3. The semiconductor memory device of claim 2, wherein each of the second width and the third width is equal to the first width.

4. The semiconductor memory device of claim 2, wherein the third width is equal to the first width, and
wherein a ratio of the second width to the third width is greater than 1 and less than or equal to 2.

5. The semiconductor memory device of claim 1, wherein the first width is greater than or equal to 5 nm and less than or equal to 25 nm.

6. The semiconductor memory device of claim 5, wherein a width in the second direction of at least one of the plurality of dummy bit-lines is less than or equal to 30 nm.

7. The semiconductor memory device of claim 1, wherein the ratio of the width in the second direction of each of the dummy bit-lines to the first width is greater than or equal to 1 and less than or equal to 1.7.

8. The semiconductor memory device of claim 7, wherein the ratio of the width in the second direction of each of the dummy bit-lines to the first width is greater than or equal to 1 and less than or equal to 1.5.

9. The semiconductor memory device of claim 1, wherein a number of the dummy bit-lines included in the dummy bit-line group is greater than or equal to 2 and less than or equal to 6.

10. The semiconductor memory device of claim 1, wherein the plurality of storage contacts includes a first storage contact, a second storage contact, and a third storage contact,
wherein the second storage contact is between the first storage contact and the third storage contact,
wherein each of the first storage contact and the second storage contact defines an air gap therein, and
wherein the third storage contact does not define an air gap.

11. The semiconductor memory device of claim 1, further comprising a plurality of bit-line contacts between the normal bit-line and the substrate, the plurality of bit-line contacts located along the first direction,
wherein the plurality of bit-line contacts include a first bit-line contact, a second bit-line contact, and a third bit-line contact,
wherein the second bit-line contact is between the first bit-line contact and the third bit-line contact,
wherein an air gap is defined between the first bit-line contact and the normal bit-line, and an air gap is defined between the third bit-line contact and the normal bit-line;
wherein an air gap not defined between the second bit-line contact and the normal bit-line.

12. The semiconductor memory device of claim 1, further comprising an information storage element connected to each of the storage contacts,
wherein the information storage element includes a lower electrode connected to a storage pad, a capacitor dielectric film on the lower electrode, and a plate upper electrode on the capacitor dielectric film.

13. A semiconductor memory device comprising:
a substrate including a cell area and a peripheral area defined by a periphery of the cell area, wherein the cell area includes a dummy cell area and a normal cell area, wherein the cell area includes an active area defined by a cell element isolation film;
a cell area separation film defining the cell area in the substrate, wherein the dummy cell area forms a boundary with the cell area separation film between the normal cell area and the cell area separation film;
a normal bit-line group on the normal cell area;
a dummy bit-line group on the dummy cell area, wherein the dummy bit-line group includes a plurality of dummy bit-lines extending in a first direction; and
a plurality of storage contacts connected to the active area and located along a second direction perpendicular to the first direction,
wherein the normal bit-line group includes a plurality of normal bit-lines extending in the first direction, wherein the plurality of normal bit-lines are spaced from each other by a bit-line pitch in the second direction,
wherein a width in the second direction of the dummy cell area is greater than the bit-line pitch and is less than or equal to 5 times the bit-line pitch,
wherein each of the normal bit-lines has a first width in the second direction, and
wherein a ratio of a width in the second direction of each of the dummy bit-lines to the first width is greater than or equal to 1 and less than or equal to 2.

14. The semiconductor memory device of claim 13, wherein the dummy bit-line group includes a first dummy bit-line closest to the peripheral area in the second direction, and a second dummy bit-line between the first dummy bit-line and at least one of the plurality of normal bit-lines,
wherein a width in the second direction of the first dummy bit-line is a second width greater than the first width, and
wherein a width in the second direction of the second dummy bit-line is equal to the first width.

15. The semiconductor memory device of claim 13, wherein the width in the second direction of each of the dummy bit-lines is equal to the first width.

16. The semiconductor memory device of claim 13, wherein the first width is greater than or equal to 5 nm and less than or equal to 25 nm.

17. The semiconductor memory device of claim 16, wherein the width in the second direction of each of the dummy bit-lines is less than or equal to 30 nm.

18. A semiconductor memory device comprising:
a substrate including a cell area and a peripheral area defined by a periphery of the cell area, wherein the cell area includes a dummy cell area and a normal cell area, wherein the cell area includes an active area defined by a cell element isolation film;
a cell area separation film defining the cell area in the substrate, wherein the dummy cell area forms a boundary with the cell area separation film between the normal cell area and the cell area separation film;
a normal bit-line on the normal cell area and extending in a first direction;
a dummy bit-line group on the dummy cell area, wherein the dummy bit-line group includes a plurality of dummy bit-lines extending in the first direction; and
a plurality of storage contacts connected to the active area and located along a second direction perpendicular to the first direction,
wherein a width in the second direction of the dummy cell area is greater than or equal to 50 nm and less than or equal to 200 nm,
wherein a width in the second direction of the normal bit-line is greater than or equal to 5 nm and less than or equal to 25 nm,
wherein a width in the second direction of each of the dummy bit-lines is greater than or equal to 5 nm and less than or equal to 30 nm.

19. The semiconductor memory device of claim 18, wherein the dummy bit-line group includes a first dummy bit-line closest to the peripheral area in the second direction, and a second dummy bit-line between the first dummy bit-line and the normal bit-line,
wherein a width in the second direction of the first dummy bit-line is greater than a width in the second direction of the second dummy bit-line.

20. The semiconductor memory device of claim 18, wherein the dummy bit-line group includes a first dummy bit-line closest to the peripheral area in the second direction, and a second dummy bit-line between the first dummy bit-line and the normal bit-line,
wherein a width in the second direction of the first dummy bit-line is equal to a width in the second direction of the second dummy bit-line.

* * * * *